US011258527B2

(12) United States Patent
Schubert et al.

(10) Patent No.: US 11,258,527 B2
(45) Date of Patent: *Feb. 22, 2022

(54) MULTI-CHANNEL INTEGRATED PHOTONIC WAVELENGTH DEMULTIPLEXER

(71) Applicant: X Development LLC, Mountain View, CA (US)

(72) Inventors: Martin Schubert, Mountain View, CA (US); Brian Adolf, San Mateo, CA (US); Jesse Lu, Hollister, CA (US)

(73) Assignee: X Development LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/084,032

(22) Filed: Oct. 29, 2020

(65) Prior Publication Data

US 2021/0143930 A1    May 13, 2021

Related U.S. Application Data

(63) Continuation of application No. 16/679,579, filed on Nov. 11, 2019, now Pat. No. 10,862,610.

(51) Int. Cl.
*H04J 14/02* (2006.01)
*H04B 10/25* (2013.01)
(Continued)

(52) U.S. Cl.
CPC .............. *H04J 14/02* (2013.01); *G06F 30/30* (2020.01); *G06F 30/367* (2020.01); *H04B 10/25* (2013.01)

(58) Field of Classification Search
CPC ..................................................... H04J 14/02
See application file for complete search history.

(56) References Cited

U.S. PATENT DOCUMENTS

| 4,279,464 A | 7/1981 | Colombini |
| 4,696,536 A | 9/1987 | Albares et al. |

(Continued)

FOREIGN PATENT DOCUMENTS

| CN | 101595411 A | 12/2009 |
| EP | 2080046 B1 | 4/2013 |

(Continued)

OTHER PUBLICATIONS

Su et al., "Inverse Design and Demonstration of a Compact on-Chip Narrowband Three-Channel Wavelength Demultiplexer", ACS Photonics 2018, Publication Date: Nov. 10, 2017 (Year: 2017).*

(Continued)

*Primary Examiner* — Shi K Li
(74) *Attorney, Agent, or Firm* — Christensen O'Connor Johnson Kindness PLLC

(57) ABSTRACT

A multi-channel photonic demultiplexer includes an input region to receive a multi-channel optical signal including four distinct wavelength channels, four output regions, each adapted to receive a corresponding one of the four distinct wavelength channels demultiplexed from the multi-channel optical signal, and a dispersive region optically disposed between the input region and the four output regions. The dispersive region includes a first material and a second material inhomogeneously interspersed to form a plurality of interfaces that each correspond to a change in refractive index of the dispersive region and collectively structure the dispersive region to optically separate each of the four distinct wavelength channels from the multi-channel optical signal and respectively guide each of the four distinct wavelength channels to the corresponding one of the four output regions.

21 Claims, 10 Drawing Sheets

(51) Int. Cl.
*G06F 30/30* (2020.01)
*G06F 30/367* (2020.01)

(56) References Cited

U.S. PATENT DOCUMENTS

| | | |
|---|---|---|
| 5,774,693 A | 6/1998 | Hsu et al. |
| 6,281,997 B1 | 8/2001 | Alexander et al. |
| 6,567,196 B1 | 5/2003 | Archambault |
| 6,606,427 B1 | 8/2003 | Graves et al. |
| 6,618,535 B1 | 9/2003 | Reynolds |
| 6,734,453 B2 | 5/2004 | Atanackovic et al. |
| 6,772,076 B2 | 8/2004 | Yamamoto et al. |
| 8,532,446 B2 | 9/2013 | Zheng et al. |
| 8,792,786 B2 | 7/2014 | Whelihan et al. |
| 9,589,757 B1 | 3/2017 | Hannon et al. |
| 2002/0110306 A1 | 8/2002 | Hamada |
| 2004/0156610 A1 | 8/2004 | Charlton et al. |
| 2004/0225483 A1 | 11/2004 | Okoniewski et al. |
| 2014/0365188 A1 | 12/2014 | Doerr |
| 2015/0295672 A1 | 10/2015 | Okayama |
| 2016/0012176 A1 | 1/2016 | Liu et al. |
| 2016/0018595 A1 | 1/2016 | Krishnamurthi et al. |
| 2016/0033765 A1 | 2/2016 | Liu et al. |
| 2016/0036550 A1 | 2/2016 | Welch |
| 2016/0119057 A1 | 4/2016 | Mekis et al. |
| 2016/0174902 A1 | 6/2016 | Georgescu et al. |
| 2018/0018757 A1 | 1/2018 | Suzuki |
| 2018/0045953 A1 | 2/2018 | Fan et al. |

FOREIGN PATENT DOCUMENTS

| | | |
|---|---|---|
| JP | 2017524966 A | 8/2017 |
| KR | 20140112818 A | 3/2013 |
| KR | 101885080 B1 | 8/2018 |
| WO | 2015034802 A1 | 3/2015 |
| WO | 2017/176370 A1 | 10/2017 |
| WO | 2017/223560 A1 | 12/2017 |

OTHER PUBLICATIONS

Piggott et al., "Fabrication-constrained nanophotonic inverse design", Scientific Reports, May 2017 (Year: 2017).*
Yilmaz et al., "Inverse design of efficient and compact 1xN wavelength demultiplexer", Optical Communications, Elsevier, Sep. 7, 2019 (Year: 2019).*
Taiwanese Office Action dated Jul. 13, 2021, in corresponding Taiwanese Patent Application No. 109138556, 14 pages.
International Search Report and Written Opinion, dated Feb. 9, 2021, in corresponding International Patent Application No. PCT/US2020/056674, 10 pages.
International Search Report and Written Opinion, dated Feb. 9, 2021, in corresponding International Patent Application No. PCT/US2020/056695, 13 pages.
Taiwanese Office Action, with English Translation, dated Jul. 13, 2021, in corresponding Taiwanese Patent Application No. 109138556, 23 pages.
Vercruysse et al., "Analytical level set fabrication constraints for inverse design", Scientific Reports, www.nature.com/scientificreports, Jun. 21, 2019.
Wavelength-division multiplexing, Wikipedia Article, https://en.wikipedia/org/wiki/wavelength-division_multiplexing, Jan. 28, 2019.
400G CWDM8 MSA 2 km Optical Interface Technical Specifications Revision 1.1., Feb. 13, 2018, 16 pages.
400G CWDM8 10 km Optical Interface Technical Specifications Revision 1.1., Feb. 13, 2018, 16 pages.
Su et al., "Inverse Design and demonstration of a compact on-chip narrowband three-channel wavelength demultiplexer", arXiv:1709.08809v1 [physics.app-ph] Aug. 17, 2017, 6 pages.
Mehdizadeh et al., "All Optical 8-channel wavelength division demultiplexer based on photonic crystal ring resonators", Department of Electrical Engineering, Shahid Chamran University of Ahvaz, 5 pages.
CWDM Optical Modules, 4/8/16/18 Channel CWDM Optical Mux/Demux Modules, Space-saving, modular platform for advanced signal processing, www.grassvalley.com, 2 pages.
OP+CWDM8+UD, 8-Channel Passive CWDM Multiplexer/Demultiplexer, http://www.imaginecommunications.com/products/networking/processing/selenio-6800/selenio-6800-fiber-optics/opcwdm8ud, 3 pages.
WaveReady 8-Channel Modular Multiplexer/Demultiplexer Upgradeable to 40 Channels, MDX-08MD1Z1xB, www.lumentum.com, 4 pages.
Moscoso-Mártir et al. "8-channel WDM silicon photonics transceiver with SOA and semiconductor mode-locked laser", Optics Express 25446, vol. 26, No. 19, Sep. 17, 2018, 14 pages.
Absil et al., "Advances in silicon photonics WDM devices", http://proceedings.spiedigitallibrary.org, SPIE vol. 9010 90100J-1, Oct. 6, 2014, 7 pages.
8-Channel Analog Multiplexer/Demultiplexer with Injection-Current Effect Control, Texas Instruments, Oct. 2012, 21 pages.
Chen, et al., "Neural Ordinary Differential Equations", 32nd Conference on Neural Information Processing Systems (NIPS 2018), Oct. 22, 2018, 18 pages.
Petykiewicz et al., "Active Nanophotonics: Inverse Design and Strained Germanium Light Emitters", A Dissertation Submitted to the Department of Electrical Engineering and the Committee on Graduate Studies of Stanford University, Oct. 2016. 134 pages.
Ying-Shou Lu "Nanophotonic Computational Design", A Dissertation Submitted to the Department of Electrical Engineering and the Committee on Graduate Studies of Stanford University, Jun. 2013, 122 pages.
Piggott, "Automated Design of Photonic Devices", A Dissertation Submitted to the Department of Electrical Engineering and the Committee on Graduate Studies of Stanford University, Jun. 2018, 112 pages.
Lu, et al., "Nanophotonic Computational Design", Optics Express, vol. 21, No. 11, Jun. 3, 2013, 17 pages.
Piggott et al., "Inverse Design and Implementation of a Wavelength Demultiplexing Grating Coupler", Scientific Reports, Nov. 27, 2014, 5 pages.
Piggott et al.,"Inverse Design and Demonstration of a Compact and Broadband On-Chip Wavelength Demultiplexer", Nature Photonics, May 11, 2015, 5 pages.
Piggott et al.,"Silicon Photonics: Design Approach to Integrated Photonics Explores Entire Space of Fabricable Devices", Laser Focus World, Aug. 13, 2018, 5 pages.
Piggott et al.,"Fabrication-constrained Nanophotonic Inverse Design", Scientific Reports, May 11, 2017, 7 pages.
Su et al., Fully-Automated Optimization of Grating Couplers, Optics Express, vol. 26, No. 4m Feb. 2018, 12 pages.
Robinson "First-Principle Derivation of Gain in High-Index-Contrast Waveguides", Optics Express, vol. 16, No. 21, Oct. 13, 2008, 11 pages.
Lalau-Keraly et al., "Adjoint Shape Optimization Applied to Electromagnetic Design", Optical Society of America, 2013, 9 pages.
Yilmaz et al., "Inverse design of efficient and compact 1 x N wavelength demultiplexer", Optics Communications, www.elsevier.com/locate/optcom, Sep. 7, 2019, 7 pages.
U.S. Appl. No. 16/685,473, filed Nov. 15, 2019, 81 pages.

* cited by examiner

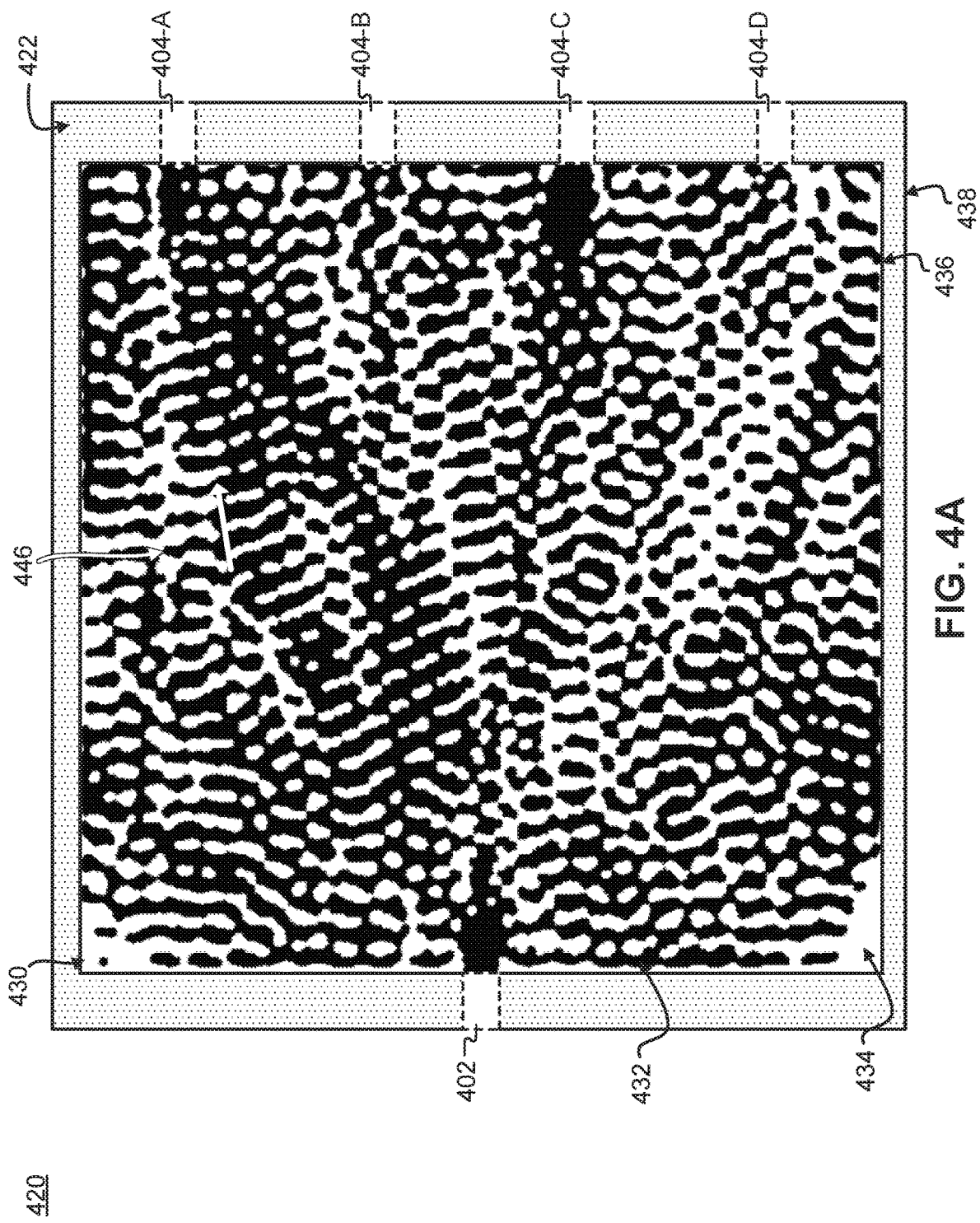

MULTI-CHANNEL INTEGRATED PHOTONIC WAVELENGTH DEMULTIPLEXER

CROSS-REFERENCE TO RELATED APPLICATION

This application is a continuation of U.S. application Ser. No. 16/679,579, filed on Nov. 11, 2019, the contents of which are incorporated herein by reference.

TECHNICAL FIELD

This disclosure relates generally to photonic devices, and in particular but not exclusively, relates to optical multiplexers and demultiplexers.

BACKGROUND INFORMATION

Fiber-optic communication is typically employed to transmit information from one place to another via light that has been modulated to carry the information. For example, many telecommunication companies use optical fiber to transmit telephone signals, internet communication, and cable television signals. But the cost of deploying optical fibers for fiber-optic communication may be prohibitive. As such, techniques have been developed to more efficiently use the bandwidth available within a single optical fiber. Wavelength-division multiplexing is one such technique that bundles multiple optical carrier signals onto a single optical fiber using different wavelengths.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale, emphasis instead being placed upon illustrating the principles being described.

FIGS. 4A-4B illustrate a more detailed cross-sectional view of a dispersive region of an example photonic demultiplexer, in accordance with an embodiment of the present disclosure.

DETAILED DESCRIPTION

Figure 1:
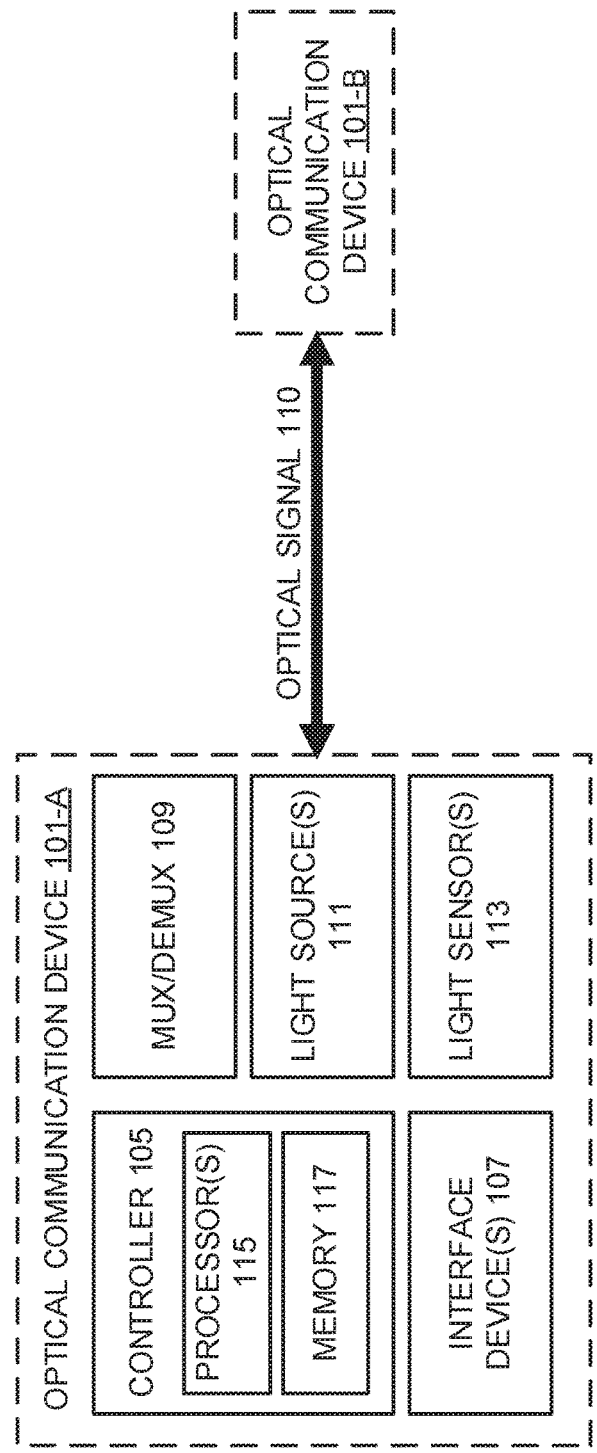
FIG. 1 is a functional block diagram illustrating a system for optical communication between two optical communication devices via an optical signal, in accordance with an embodiment of the present disclosure.

Embodiments of photonic integrated circuits, including a multi-channel photonic demultiplexer, as well as a method for generating a design of photonic integrated circuits are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Wavelength division multiplexing and its variants (e.g., dense wavelength division multiplexing, coarse wavelength division multiplexing, and the like) take advantage of the bandwidth of optical fibers by bundling multiple optical carrier signals onto a single optical fiber. Once the multiple carrier signals are bundled together, they are transmitted from one place to another over the single optical fiber where they may be demultiplexed to be read out by an optical communication device. However, devices that decouple the carrier signals from one another remain prohibitive in terms of cost, size, and the like.

Moreover, design of photonic devices, such as those used for optical communication, are traditionally designed via conventional techniques sometimes determined through a simple guess and check method or manually-guided grid-search in which a small number of design parameters from pre-determined designs or building blocks are adjusted for suitability to a particular application. However, in actuality, these devices may have design parameters ranging from hundreds all the way to many billions or more, dependent on the device size and functionality. Thus, as functionality of photonic devices increases and manufacturing tolerances improve to allow for smaller device feature sizes, it becomes increasingly important to take full advantage of these improvements via optimized device design.

Described herein are embodiments of a photonic integrated circuit (e.g., a multi-channel photonic demultiplexer and/or multiplexer) having a design obtainable by an inverse design process. More specifically, techniques described in embodiments herein utilize gradient-based optimization in combination with first-principle simulations to generate a design from an understanding of the underlying physics that are expected to govern the operation of the photonic integrated circuit. It is appreciated in other embodiments, design optimization of photonic integrated circuits without gradient-based techniques may also be used. Advantageously, embodiments and techniques described herein are not limited to conventional techniques used for design of photonic devices, in which a small number of design parameters for pre-determined building blocks are adjusted based on suitability to a particular application. Rather, the first-principles based designs described herein are not necessarily dependent on human intuition and generally may result in designs which outstrip current state-of-the-art designs in performance, size, robustness, or a combination thereof. Further still, rather than being limited to a small number of design parameters due to conventional techniques, the embodiments and techniques described herein may provide scalable optimization of a nearly unlimited number of design parameters.

FIG. 1 is a functional block diagram illustrating a system 100 for optical communication (e.g., via wavelength division multiplexing or other techniques) between optical communication devices 101-A and 101-B via optical signal 110, in accordance with an embodiment of the present disclosure. More generally, optical communication device 101-A is configured to transmit information by modulating light from one or more light sources into a multi-channel optical signal 110 (e.g., a singular optical signal that includes a plurality of distinct wavelength channels) that is subsequently transmitted from optical communication device 101-A to optical communication device 101-B via an optical fiber, a light guide, a wave guide, or other photonic device. Optical communication device 101-B receives the multi-channel optical signal 110 and demultiplexes each of the plurality of distinct wavelength channels from the multi-channel optical signal 110 to extract the transmitted information. It is appreciated that in some embodiments optical communication devices 101-A and 101-B may be distinct and separate devices (e.g., an optical transceiver or transmitter communicatively coupled via one or more optical fibers to a separate optical transceiver or receiver). However, in other embodiments, optical communication devices 101-A and 101-B may be part of a singular component or device (e.g., a smartphone, a tablet, a computer, optical device, or the like). For example, optical communication devices 101-A and 101-B may both be constituent components on a monolithic integrated circuit that are coupled to one another via a waveguide that is embedded within the monolithic integrated circuit and is adapted to carry optical signal 110 between optical communication devices 101-A and 101-B or otherwise transmit the optical signal between one place and another.

In the illustrated embodiment, optical communication device 101-A includes a controller 105, one or more interface devices 107 (e.g., fiber optic couplers, light guides, waveguides, and the like), a multiplexer (mux), demultiplexer (demux), or combination thereof 109, one or more light sources 111 (e.g., light emitting diodes, lasers, and the like), and one or more light sensors 113 (e.g., photodiodes, phototransistors, photoresistors, and the like) coupled to one another. The controller includes one or more processors 115 (e.g., one or more central processing units, application specific circuits, field programmable gate arrays, or otherwise) and memory 117 (e.g., volatile memory such as DRAM and SAM, non-volatile memory such as ROM, flash memory, and the like). It is appreciated that optical communication device 101-B may include the same or similar elements as optical communication device 101-A, which have been omitted for clarity.

Controller 105 orchestrates operation of optical communication device 101-A for transmitting and/or receiving optical signal 110 (e.g., a multi-channel optical signal having a plurality of distinct wavelength channels or otherwise). Controller 105 includes software (e.g., instructions included in memory 117 coupled to processor 115) and/or hardware logic (e.g., application specific integrated circuits, field-programmable gate arrays, and the like) that when executed by controller 105 causes controller 105 and/or optical communication device 101-A to perform operations.

In one embodiment, controller 105 may choreograph operations of optical communication device 101-A to cause light sources 111 to generate a plurality of distinct wavelength channels that are multiplexed via mux/demux 109 into a multi-channel optical signal 110 that is subsequently transmitted to optical communication device 101-B via interface device 107. In other words, light sources 111 may output light having different wavelengths (e.g., 1271 nm, 1291 nm, 1311 nm, 1331 nm, 1511 nm, 1531 nm, 1551 nm, 1571 nm, or otherwise) that may be modulated or pulsed via controller 105 to generate a plurality of distinct wavelength channels representative of information. The plurality of distinct wavelength channels are subsequently combined or otherwise multiplexed via mux/demux 109 into a multi-channel optical signal 110 that is transmitted to optical communication device 101-B via interface device 107. In the same or another embodiment, controller 105 may choreograph operations of optical communication device 101-A to cause a plurality of distinct wavelength channels to be demultiplexed via mux/demux 109 from a multi-channel optical signal 110 that is received via interface device 107 from optical communication device 101-B.

It is appreciated that in some embodiments certain elements of optical communication device 101-A and/or 101-B may have been omitted to avoid obscuring certain aspects of the disclosure. For example, optical communication devices 101-A and 101-B may include amplification circuitry, lenses, or components to facilitate transmitting and receiving optical signal 110. It is further appreciated that in some embodiments optical communication devices 101-A and/or 101-B may not necessarily include all elements illustrated in FIG. 1. For example, in one embodiment optical communication device 101-A and/or 101-B are passive devices that operate as an intermediary device that may passively multiplex a plurality of distinct wavelength channels into a multi-channel optical signal 110 and/or demultiplex a plurality of distinct wavelength channels from a multi-channel optical signal 110.

Figure 2A:
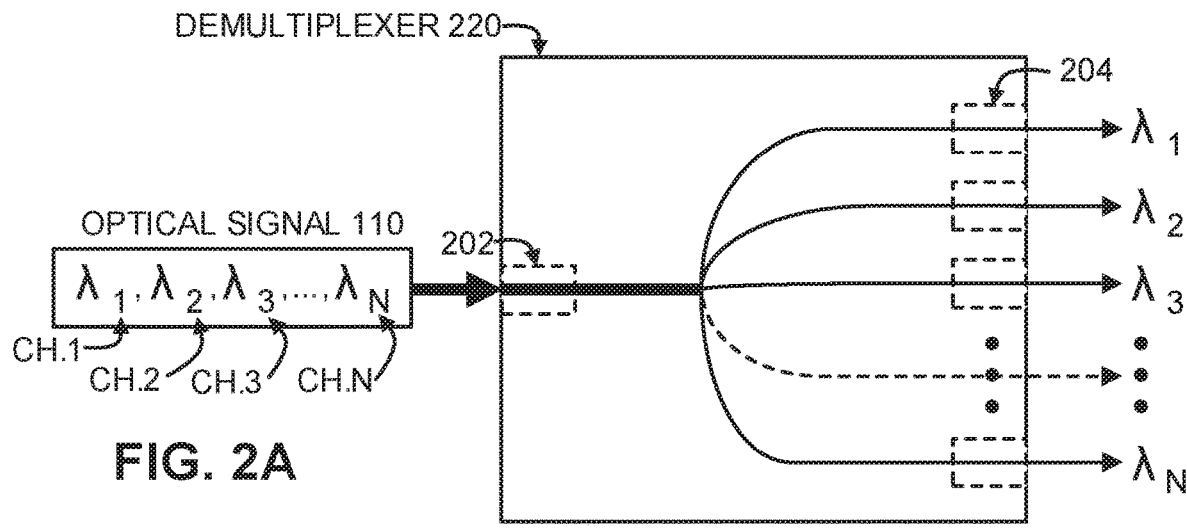
FIGS. 2A and 2B respectively illustrate an example demultiplexer and multiplexer, in accordance with an embodiment of the present disclosure.
Figure 2B:
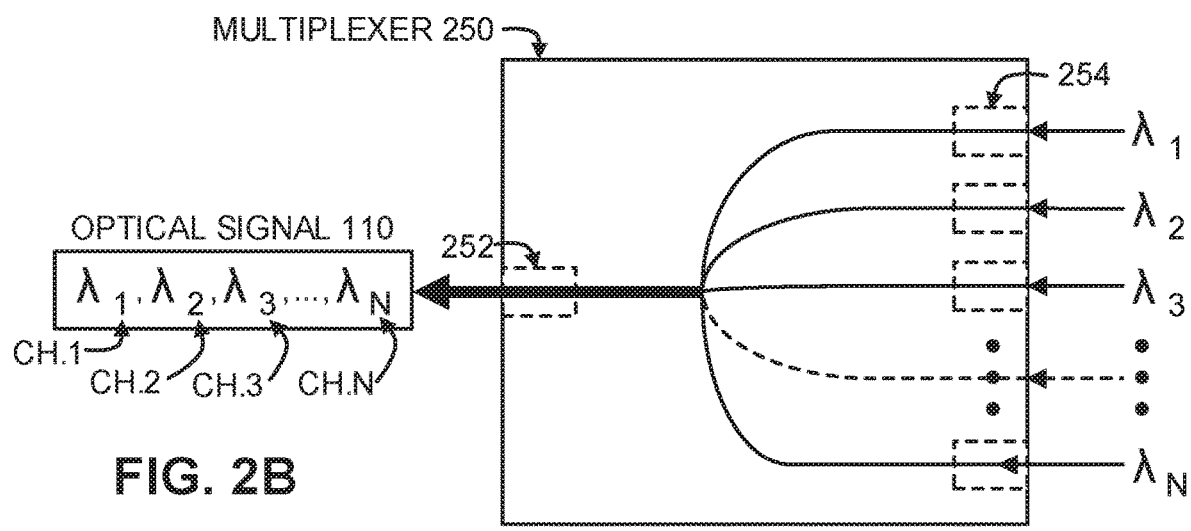

FIGS. 2A and 2B respectively illustrate an example demultiplexer 220 and multiplexer 250, in accordance with an embodiment of the present disclosure. Demultiplexer 220 and multiplexer 250 are possible embodiments of mux/demux 109 illustrated in FIG. 1, and which may be part of an integrated photonic circuit, silicon photonic device, or otherwise.

As illustrated in FIG. 2A, demultiplexer 220 includes an input region 202 and a plurality of output regions 204. Demultiplexer 220 is configured to receive a multi-channel optical signal 110 that includes a plurality of distinct wavelength channels (e.g., Ch. 1, Ch. 2, Ch. 3, . . . Ch. N, each having a center wavelength respectively corresponding to $\lambda_1, \lambda_2, \lambda_3, \ldots \lambda_N$) via input region 202 (e.g., a waveguide that may correspond to interface device 107 illustrated in FIG. 1) to optically separate each of the plurality of distinct wavelength channels from the multi-channel optical signal 110 and respectively guide each of the plurality of distinct wavelength channels to a corresponding one of a plurality of output regions 204 (e.g., a plurality of waveguides that may correspond to interface devices 107 illustrated in FIG. 1). More specifically, in the illustrated embodiment, each of the output regions receives a portion of the multi-channel optical signal that corresponds to, or is otherwise representative of, one of the plurality of distinct wavelength channels that may be output as plurality of optical signals (e.g., $\lambda_1$, $\lambda_2$, $\lambda_3$, . . . $\lambda_N$). The plurality of output regions may each be coupled to a respective light sensor (e.g., corresponding to light sensor 113 illustrated in FIG. 1), which may be utilized to convert the optical signals demultiplexed from the multi-channel optical signal 110 into electrical signals for further processing.

In the illustrated embodiment of FIG. 2B, multiplexer 250 includes a plurality of input regions 254 and an output region 252. Multiplexer is configured to receive a plurality of distinct optical signals (e.g., $\lambda_1$, $\lambda_2$, $\lambda_3$, . . . $\lambda_N$), each at a respective one of the plurality of input regions 254 (e.g., a plurality of waveguides that may correspond to interface devices 107 illustrated in FIG. 1). Multiplexer 250 is structured or otherwise configured to optically combine (i.e., multiplex) each of the plurality of distinct wavelength channels into a multi-channel optical signal 110 that is guided to output region 252 (e.g., a waveguide that may correspond to interface device 107 illustrated in FIG. 1). It is appreciated that in some embodiments, demultiplexer 220 illustrated in FIG. 2A and multiplexer 250 illustrated in FIG. 2B may be bidirectional such that each device may function as both a demultiplexer and multiplexer.

Figure 2C:
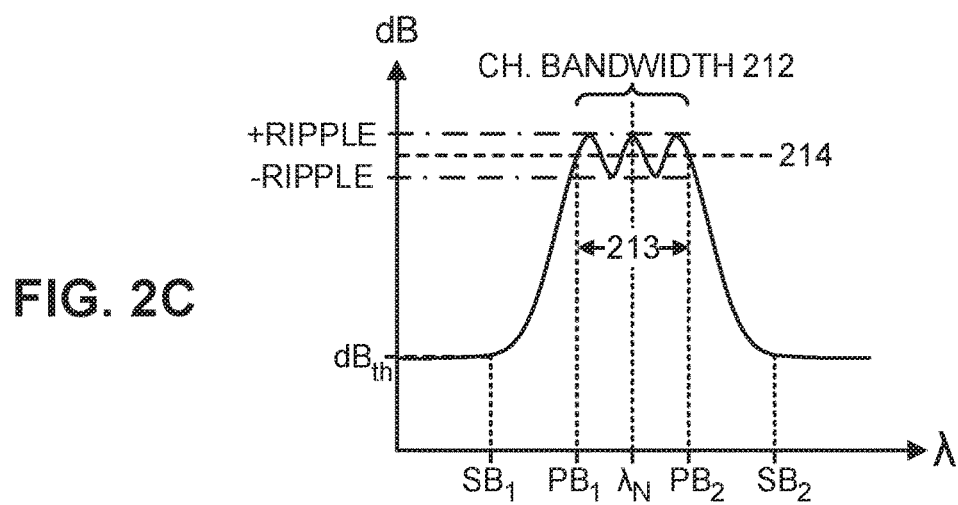
FIG. 2C illustrates an example distinct wavelength channel of a multi-channel optical signal, in accordance with an embodiment of the present disclosure.

FIG. 2C illustrates an example distinct wavelength channel of a multi-channel optical signal (e.g., Ch. N is multi-channel optical signal 110 illustrated in FIGS. 1, 2A, and 2B), in accordance with an embodiment of the present disclosure. The example channel may be representative of an individual channel included in a plurality of distinct wavelength channels of the multi-channel optical signal that may be demultiplexed and/or multiplexed by demultiplexer 220 of FIG. 2A and/or multiplexer 250 of FIG. 2B. Each of the distinct wavelength channels may have different center wavelengths ($\lambda_N$) including at least one of 1271 nm, 1291 nm, 1311 nm, 1331 nm, 1511 nm, 1531 nm, 1551 nm, or 1571 nm, or otherwise. In the illustrated embodiment of FIG. 2C, the distinct wavelength channel has a channel bandwidth 212 of approximately 13 nm wide. However, in other embodiments the channel bandwidth may be different than 13 nm wide. Rather, the channel bandwidth may be considered a configurable parameter that is dependent upon the structure of mux/demux 109 of FIG. 1, demultiplexer 220 of FIG. 2A, and/or multiplexer 250 of FIG. 2B. For example, in some embodiments each of the plurality of distinct wavelength channels may share a common bandwidth that may correspond to 13 nm or otherwise. Referring back to FIG. 2C, the channel bandwidth 212 may be defined as the width of a passband region 213 (i.e., the region defined as being between $PB_1$ and $PB_2$). The passband region 213 may represent an approximate power transmission of a demultiplexer or multiplexer. It is appreciated that in some embodiments the passband region 213 may include ripple as illustrated in FIG. 2C, which corresponds to fluctuations within the passband region 213. In one or more embodiments, the ripple within the passband region may be +/−2 dB or less, +/−1 dB or less, +/−0.5 dB or less, or otherwise. In some embodiments, the channel bandwidth 212 may be defined by the passband region 213. In other embodiments, the channel bandwidth 212 may be defined as the measured power above a threshold (e.g., $dB_{th}$). For example, demultiplexer 220 illustrated in FIG. 2A may optically separate channel N from multi-channel optical signal 110 and have a corresponding channel bandwidth for channel N equivalent to the range of wavelengths above a threshold value that are transmitted to the output region 204 mapped to channel N (i.e., $\lambda_N$). In the same or other embodiments, isolation of the channel (i.e., defined by channel bandwidth 212) may also be considered when optimizing the design. The isolation may be defined as a ratio between the passband region 213 and the stopband regions (e.g., regions less than $SB_1$ and greater than $SB_2$). It is further appreciated that transition band regions (e.g., a first transition region between $SB_1$ and $PB_1$ and a second transition region between $PB_2$ and $SB_2$) are exemplary and may be exaggerated for the purposes of illustration. In some embodiments, optimization of the design of the photonic demultiplexer may also include a target metric for a slope, width, or the like of the transition band regions.

FIGS. 3A-3D illustrate different views of an example photonic demultiplexer 320, in accordance with an embodiment of the present disclosure. Photonic demultiplexer 320 is one possible implementation of mux/demux 109 illustrated in FIG. 1 and demultiplexer 220 illustrated in FIG. 2A. It is further appreciated that while discussion henceforth may be directed towards photonic integrated circuits capable of demultiplexing a plurality of distinct wavelength channels from a multi-channel optical signal, that in other embodiments, a demultiplexer (e.g., demultiplexer 320) may also or alternatively be capable of multiplexing a plurality of distinct wavelength channels into a multi-channel optical signal, in accordance with embodiments of the present disclosure.

Figure 3A:
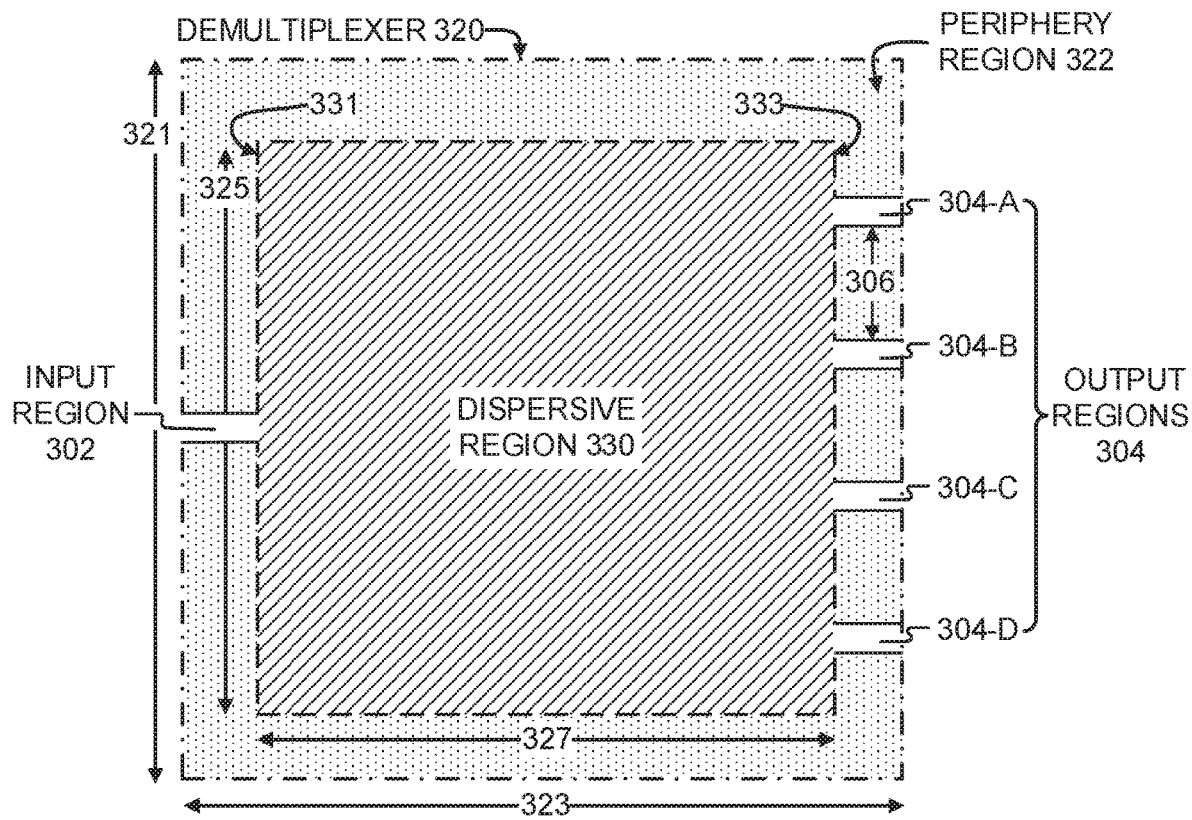
FIGS. 3A-3D illustrate different views of an example photonic demultiplexer, in accordance with an embodiment of the present disclosure.

FIG. 3A illustrates a cross-sectional view of demultiplexer 320 along a lateral plane within an active layer defined by a width 321 and a length 323 of the demultiplexer 320. As illustrated, demultiplexer 320 includes an input region 302 (e.g., comparable to input region 202 illustrated in FIG. 2A), a plurality of output regions 304 (e.g., comparable to plurality of output regions 204 illustrated in FIG. 2A), and a dispersive region optically disposed between the input region 302 and plurality of output regions 304. The input region 302 and plurality of output regions 304 (e.g., 304-A, 304-B, 304-C, and 304-D) may each be waveguides (e.g., slab waveguide, strip waveguide, slot waveguide, or the like) capable of propagating light along the path of the waveguide. The dispersive region 330 includes a first material and a second material (see, e.g., FIG. 3D) inhomogeneously interspersed to form a plurality of interfaces that each correspond to a change in refractive index of the dispersive region 330 and collectively structure the dispersive region 330 to optically separate each of a plurality of distinct wavelength channels (e.g., Ch. 1, Ch. 2, Ch. 3, . . . Ch. N illustrated in FIG. 2A) from a multi-channel optical signal (e.g., optical signal 110 illustrated in FIG. 2A) and respectively guide each of the plurality of distinct wavelength channels to a corresponding one of the plurality of output regions 304 when the input region 302 receives the multi-channel optical signal. In other words, input region 302 is adapted to receive the multi-channel optical signal including a plurality of distinct wavelength channels and the plurality of output regions 304 are adapted to each receive a corresponding one of the plurality of distinct wavelength channels demultiplexed from the multi-channel optical signal via dispersive region 330.

Figure 3B:
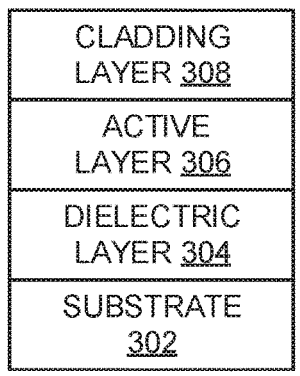
Figure 3C:
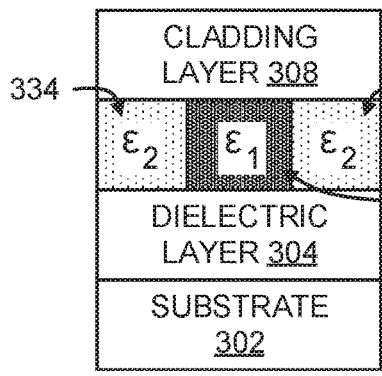
Figure 3D:
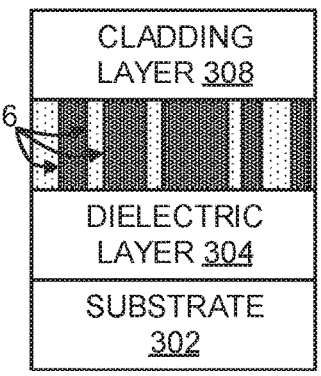
Figure 4B:
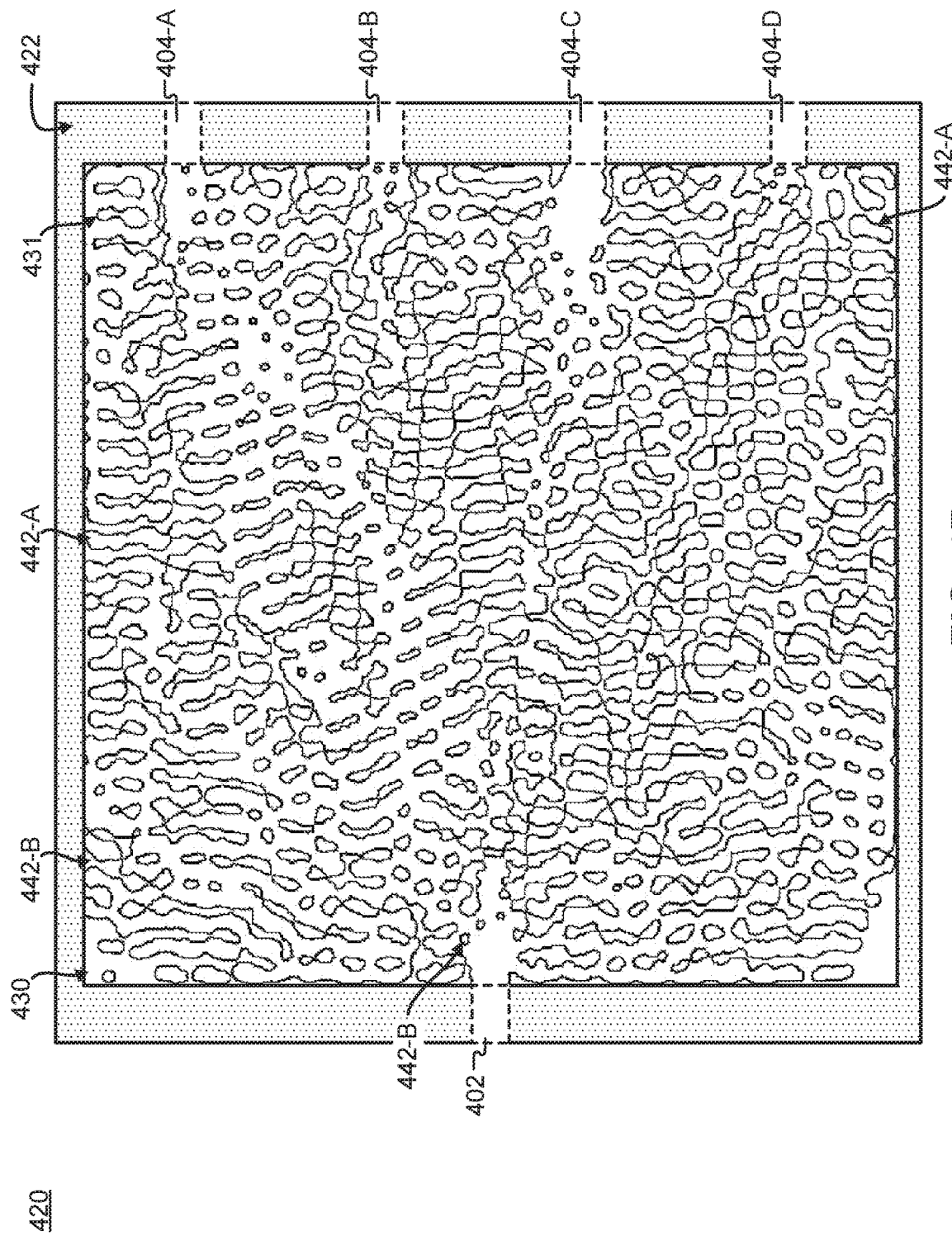

As illustrated in FIG. 3A, and more clearly shown in FIGS. 3D and 4A-4B, the shape and arrangement of the first and second material that are inhomogeneously interspersed create a plurality of interfaces that collectively form a material interface pattern along a cross-sectional area of dispersive region 330 that is at least partially surrounded by a periphery boundary region 322 that includes the second material. In some embodiments periphery region 322 has a substantially homogeneous composition that includes the second material. In the illustrated embodiment, dispersive region 330 includes a first side 331 and a second side 333 that each interface with an inner boundary (i.e., the unlabeled dashed line of periphery region 322 disposed between dispersive region 330 and dashed-dotted line corresponding to an outer boundary of periphery region 322). First side 331 and second side 333 are disposed correspond to opposing sides of dispersive region 330. Input region 302 is disposed proximate to first side 331 (e.g., one side of input region 302 abuts first side 331 of dispersive region 330) while each of the plurality of output regions 304 are disposed proximate to second side 333 (e.g., one side of each of the plurality of output regions 304 abuts second side 333 of dispersive region 330).

In the illustrated embodiment each of the plurality of output regions 304 are parallel to each other one of the plurality of output regions 304. However, in other embodiments the plurality of output regions 304 may not be parallel to one another or even disposed on the same side (e.g., one or more of the plurality of output regions 304 and/or input region 302 may be disposed proximate to sides of dispersive region 330 that are adjacent to first side 331 and/or second side 333). In some embodiments adjacent ones of the plurality of output regions are separated from each other by a common separation distance when the plurality of output regions includes at least three output regions. For example, as illustrated adjacent output regions 304-A and 304-B are separated from one another by distance 306, which may be common to the separation distance between other pairs of adjacent output regions.

As illustrated in the embodiment of FIG. 3A, demultiplexer 320 includes four output regions 304 (e.g., 304-A, 304-B, 304-C, and 304-D) that are each respectively mapped (i.e., by virtue of the structure of dispersive region 330) to a respective one of four channels included in a plurality of distinct wavelength channels. More specifically, the plurality of interfaces of dispersive region 330, defined by the inhomogeneous interspersion of a first material and a second material, form a material interface pattern along a cross-sectional area of the dispersion region 330 (e.g., as illustrated in FIG. 3A, 4A, or 4B) to cause the dispersive region 330 to optically separate each of the four channels from the multi-channel optical signal and route each of the four channels to a respective one of the four output regions 304 when the input region 302 receives the multi-channel optical signal.

It is noted that the first material and second material of dispersive region 330 are arranged and shaped within the dispersive region such that the material interface pattern is substantially proportional to a design obtainable with an inverse design process, which will be discussed in greater detail later in the present disclosure. More specifically, in some embodiments, the inverse design process may include iterative gradient-based optimization of a design based at least in part on a loss function that incorporates a performance loss (e.g., to enforce functionality) and a fabrication loss (e.g., to enforce fabricability and binarization of a first material and a second material) that is reduced or otherwise adjusted via iterative gradient-based optimization to generate the design. In the same or other embodiment, other optimization techniques may be used instead of, or jointly with, gradient-based optimization. Advantageously, this allows for optimization of a near unlimited number of design parameters to achieve functionality and performance within a predetermined area that may not have been possible with conventional design techniques.

For example, in one embodiment dispersive region 330 is structured to optically separate each of the four channels from the multi-channel optical signal within a predetermined area of 35 µm×35 µm (e.g., as defined by width 325 and length 327 of dispersive region 330) when the input region 302 receives the multi-channel optical signal. In the same or another embodiment, the dispersive region is structured to accommodate a common bandwidth for each of the four channels, each of the four channels having different center wavelengths. In one embodiment the common bandwidth is approximately 13 nm wide and the different center wavelengths is selected from a group consisting of 1271 nm, 1291 nm, 1311 nm, 1331 nm, 1511 nm, 1531 nm, 1551 nm, and 1571 nm. In some embodiments, the entire structure of demultiplexer 320 (e.g., including input region 302, periphery region 322, dispersive region 330, and plurality of output regions 304) fits within a predetermined area (e.g., as defined by width 321 and length 323). In one embodiment the predetermined area is 35 µm×35 µm. It is appreciated that in other embodiments dispersive region 330 and/or demultiplexer 320 fits within other areas greater than or less than 35 µm×35 µm, which may result in changes to the structure of dispersive region 330 (e.g., the arrangement and shape of the first and second material) and/or other components of demultiplexer 320.

In the same or other embodiments the dispersive region is structured to have a power transmission of −2 dB or greater from the input region 302, through the dispersive region 330, and to the corresponding one of the plurality of output regions 304 for a given wavelength within one of the plurality of distinct wavelength channels. For example, if channel 1 of a multi-channel optical signal is mapped to output region 304-A, then when demultiplexer 320 receives the multi-channel optical signal at input region 302 the dispersive region 330 will optically separate channel 1 from the multi-channel optical signal and guide a portion of the multi-channel optical signal corresponding to channel 1 to output region 304-A with a power transmission of −2 dB or greater. In the same or another embodiment, dispersive region 330 is structured such that an adverse power transmission (i.e., isolation) for the given wavelength from the input region to any of the plurality of output regions other than the corresponding one of the plurality of output regions is −30 dB or less, −22 dB or less, or otherwise. For example, if channel 1 of a multi-channel optical signal is mapped to output region 304-A, then the adverse power transmission from input region 302 to any other one of the plurality of output regions (e.g., 304-B, 304-C, 304-D) other than the corresponding one of the plurality of output regions (e.g., 304-A) is −30 dB or less, −22 dB or less, or otherwise. In some embodiments, a maximum power reflection from demultiplexer 320 of an input signal (e.g., a multi-channel optical signal) received at an input region (e.g., input region 302) is reflected back to the input region by dispersive region 330 or otherwise is −40 dB or less, −20 dB or less, −8 dB or less, or otherwise. It is appreciated that in other embodiments the power transmission, adverse power transmission, maximum power, or other performance characteristics may be different than the respective values discussed herein, but the structure of dispersive region 330 may change due to the intrinsic relationship between structure, functionality, and performance of demultiplexer 320.

FIG. 3B illustrates a vertical schematic or stack of various layers that are included in the illustrated embodiment of demultiplexer 320. However, it is appreciated that the illustrated embodiment is not exhaustive and that certain features or elements may be omitted to avoid obscuring certain aspects of the invention. In the illustrated embodiment, demultiplexer 320 includes substrate 302, dielectric layer 304, active layer 306 (e.g., as shown in the cross-sectional illustration of FIG. 3A), and a cladding layer 308. In some embodiments, demultiplexer 320 may be, in part or otherwise, a photonic integrated circuit or silicon photonic device that is compatible with conventional fabrication techniques (e.g., lithographic techniques such as photolithographic, electron-beam lithography and the like, sputtering, thermal evaporation, physical and chemical vapor deposition, and the like).

In one embodiment a silicon on insulator (SOI) wafer may be initially provided that includes a support substrate (e.g., a silicon substrate) that corresponds to substrate 302, a silicon dioxide dielectric layer that corresponds to dielectric layer 304, a silicon layer (e.g., intrinsic, doped, or otherwise), and a oxide layer (e.g., intrinsic, grown, or otherwise). In one embodiment, the silicon in the active layer 306 may be etched selectively by lithographically creating a pattern on the SOI wafer that is transferred to SOI wafer via a dry etch process (e.g., via a photoresist mask or other hard mask) to remove portions of the silicon. The silicon may be etched all the way down to dielectric layer 304 to form voids that may subsequently be backfilled with silicon dioxide that is subsequently encapsulated with silicon dioxide to form cladding layer 308. In one embodiment, there may be several etch depths including a full etch depth of the silicon to obtain the targeted structure. In one embodiment, the silicon may be 220 nm thick and thus the full etch depth may be 220 nm. In some embodiments, this may be a two-step encapsulation process in which two silicon dioxide depositions are performed with an intermediate chemical mechanical planarization used to yield a planar surface.

FIG. 3C illustrates a more detailed view of active layer 306 (relative to FIG. 3B) taken along a portion of periphery region 322 that includes input region 302 of FIG. 3A. In the illustrated embodiment, active region 306 includes a first material 332 with a refractive index of $\varepsilon_1$ and a second material 334 with a refractive index of $\varepsilon_2$ that is different from $\varepsilon_1$. Homogenous regions of the first material 332 and the second material 334 may form waveguides or portions of waveguides that correspond to input region 302 and plurality of output regions 304 as illustrated in FIGS. 3A and 3C.

FIG. 3D illustrates a more detailed view of active layer 306 (relative to FIG. 3B) taken along dispersive region 330. As described previously, dispersive region 330 includes a first material 332 (e.g., silicon) and a second material 334 (e.g., silicon dioxide) that are inhomogeneously interspersed to form a plurality of interfaces 336 that collectively form a material interface pattern. Each of the plurality of interfaces 336 that form the interface pattern corresponds to a change in refractive index of dispersive region 330 to structure the dispersive region (i.e., the shape and arrangement of first material 332 and second material 334) to provide, at least in part, the functionality of demultiplexer 320 (i.e., optical separation of the plurality of distinct wavelength channels from the multi-channel optical signal and respective guidance of each of the plurality of distinct wavelength channels to the corresponding one of the plurality of output regions 304 when the input region 302 receives the multi-channel optical signal).

It is appreciated that in the illustrated embodiments of demultiplexer 320 as shown in FIGS. 3A-3D, the change in refractive index is shown as being vertically consistent (i.e., the first material 332 and second material 334 form interfaces that are substantially vertical or perpendicular to a lateral plane or cross-section of demultiplexer 320. However, in the same or other embodiments, the plurality of interfaces (e.g., interfaces 336 illustrated in FIG. 3D) may not be substantially perpendicular with the lateral plane or cross-section of demultiplexer 320.

FIG. 4A illustrates a more detailed cross-sectional view of a dispersive region of example photonic demultiplexer 420, in accordance with an embodiment of the present disclosure. FIG. 4B illustrates a more detailed view of an interface pattern formed by the shape and arrangement of a first material 432 and a second material 434 for the dispersive region of the photonic demultiplexer 420 of FIG. 4A. Demultiplexer 420 is one possible implementation of mux/demux 109 illustrated in FIG. 1, demultiplexer 220 illustrated in FIG. 2A, and demultiplexer 320 illustrated in FIGS. 3A-3D.

As illustrated in FIGS. 4A-4B, demultiplexer 420 includes an input region 402, a plurality of output regions 404, and a dispersive region 430 optically disposed between input region 402 and plurality of output regions 404. Dispersive region 430 is surrounded, at least in part, by a peripheral region 422 that includes an inner boundary 436 and an outer boundary 438. It is appreciated that like named or labeled elements of demultiplexer 420 may similarly correspond to like named or labeled elements of other demultiplexers described in embodiments of the present disclosure.

The first material 432 (i.e., black colored regions within dispersive region 430) and second material 434 (i.e., white colored regions within dispersive region 430) of photonic demultiplexer 420 are inhomogeneously interspersed to create a plurality of interfaces that collectively form material interface pattern 431 as illustrated in FIG. 4B. More specifically, an inverse design process that utilizes iterative gradient-based optimization, Markov Chain Monte Carlo optimization, or other optimization techniques combined with first principles simulations to generate a design that is substantially replicated by dispersive region 430 within a proportional or scaled manner such that photonic demultiplexer 420 provides the desired functionality. In the illustrated embodiment, dispersive region 430 is structured to optically separate each of a plurality of distinct wavelength channels from a multi-channel optical signal and respectively guide each of the plurality of distinct wavelength channels to a corresponding one of the plurality of output regions 404 when the input region 402 receives the multi-channel optical signal. More specifically, the plurality of output regions 404-A, 404-B, 404-C, and 404-D are respectively mapped to wavelength channels having center wavelengths correspond to 1271 nm, 1291 nm, 1311 nm, and 1331 nm. In another embodiment, output regions 404-A, 404-B, 404-C, and 404-D are respectfully mapped to wavelength channels having center wavelengths that correspond to 1511 nm, 1531 nm, 1551 nm, and 1571 nm.

As illustrated in FIG. 4B material interface pattern 431, which is defined by the black lines within dispersive region 430 and corresponds to a change in refractive index within dispersive region 430, includes a plurality of protrusions 442. A first protrusion 442-A is formed of the first material 432 and extends from periphery region 422 into dispersive region 430. Similarly, a second protrusion 442-B is formed of the second material 434 and extends from periphery region 422 into dispersive region 430. Further illustrated in FIG. 4B, dispersive region 430 includes a plurality of islands 442 formed of either the first material 432 or the second material 434. The plurality islands 442 include a first island 442-A that is formed of the first material 432 and is surrounded by the second material 434. The plurality of islands 442 also includes a second island 442-B that is formed of the second material 434 and is surrounded by the first material 432.

In some embodiments, material interface pattern 431 includes one or more dendritic shapes, wherein each of the one or more dendritic shapes are defined as a branched structure formed from first material 432 or second material 434 and having a width that alternates between increasing and decreasing in size along a corresponding direction. Referring back to FIG. 4A, for clarity, dendritic structure 446 is labeled with a white arrow having a black border. As can be seen, the width of dendritic structure 446 alternatively increases and decreases in size along a corresponding direction (i.e., the white labeled arrow overlaying a length of dendritic structure 446) to create a branched structure. It is appreciated that in other embodiments there may be no protrusions, there may be no islands, there may be no dendritic structures, or there may be any number, including zero, of protrusions, islands of any material included in the dispersive region 430, dendritic structures, or a combination thereof.

In some embodiments, the inverse design process includes a fabrication loss that enforces a minimum feature size, for example, to ensure fabricability of the design. In the illustrated embodiment of photonic demultiplexer 420 illustrated in FIGS. 4A and 4B, interface pattern 431 is shaped to enforce a minimum feature size within dispersive region 430 such that the plurality of interfaces within the cross-sectional area formed with first material 432 and second material 434 do not have a radius of curvature with a magnitude of less than a threshold size. For example, if the minimum feature size is 150 nm, the radius of curvature for any of the plurality of interfaces have a magnitude of less than the threshold size, which corresponds the inverse of half the minimum feature size (i.e., $1/75$ nm$^{-1}$). Enforcement of such a minimum feature size prevents the inverse design process from generating designs that are not fabricable by considering manufacturing constraints, limitations, and/or yield. In the same or other embodiments, different or additional checks on metrics related to fabricability may be utilized to enforce a minimum width or spacing as a minimum feature size.

Figure 5:
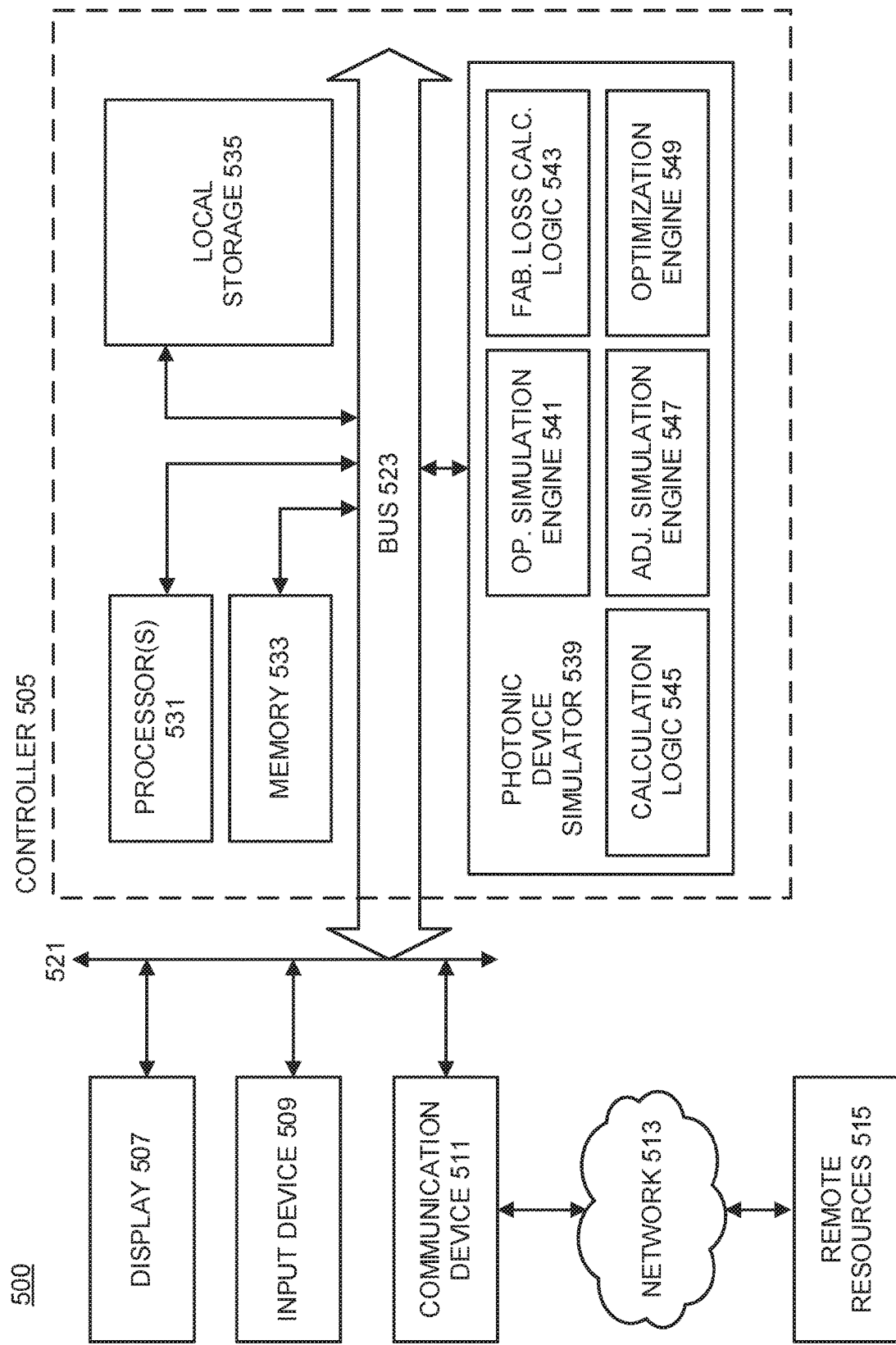
FIG. 5 is a functional block diagram illustrating a system for generating a design of a photonic integrated circuit, in accordance with an embodiment of the present disclosure.

FIG. 5 is a functional block diagram illustrating a system 500 for generating a design of a photonic integrated circuit (i.e., photonic device), in accordance with an embodiment of the disclosure. System 500 may be utilized to perform an inverse design process that generates a design with iterative gradient-based optimization that takes into consideration the underlying physics that govern the operation of the photonic integrated circuit. More specifically, system 500 is a design tool that may be utilized to optimize structural parameters (e.g., shape and arrangement of a first material and a second material within the dispersive region of the embodiments described in the present disclosure) of photonic integrated circuits based on first-principles simulations (e.g., electromagnetic simulations to determine a field response of the photonic device to an excitation source) and iterative gradient-based optimization. In other words, system 500 may provide a design obtained via the inverse design process that is substantially replicated (i.e., proportionally scaled) by dispersive regions 330 and 430 of demultiplexers 320 and 420 illustrated in FIGS. 3A and 4A, respectively.

As illustrated, system 500 includes controller 505, display 507, input device(s) 509, communication device(s) 511, network 513, remote resources 515, bus 521, and bus 523. Controller 505 includes processor 531, memory 533, local storage 535, and photonic device simulator 539. Photonic device simulator 539 includes operational simulation engine 541, fabrication loss calculation logic 543, calculation logic 545, adjoint simulation engine 547, and optimization engine 549. It is appreciated that in some embodiments, controller 505 may be a distributed system.

Controller 505 is coupled to display 507 (e.g., a light emitting diode display, a liquid crystal display, and the like) coupled to bus 521 through bus 523 for displaying information to a user utilizing system 500 to optimize structural parameters of the photonic device (i.e., demultiplexer). Input device 509 is coupled to bus 521 through bus 523 for communicating information and command selections to processor 531. Input device 509 may include a mouse, trackball, keyboard, stylus, or other computer peripheral, to facilitate an interaction between the user and controller 505. In response, controller 505 may provide verification of the interaction through display 507.

Another device, which may optionally be coupled to controller 505, is a communication device 511 for accessing remote resources 515 of a distributed system via network 513. Communication device 511 may include any of a number of networking peripheral devices such as those used for coupling to an Ethernet, Internet, or wide area network, and the like. Communication device 511 may further include a mechanism that provides connectivity between controller 505 and the outside world. Note that any or all of the components of system 500 illustrated in FIG. 5 and associated hardware may be used in various embodiments of the present disclosure. The remote resources 515 may be part of a distributed system and include any number of processors, memory, and other resources for optimizing the structural parameters of the photonic device.

Controller 505 orchestrates operation of system 500 for optimizing structural parameters of the photonic device. Processor 531 (e.g., one or more central processing units, graphics processing units, and/or tensor processing units, etc.), memory 533 (e.g., volatile memory such as DRAM and SRAM, non-volatile memory such as ROM, flash memory, and the like), local storage 535 (e.g., magnetic memory such as computer disk drives), and the photonic device simulator 539 are coupled to each other through bus 523. Controller 505 includes software (e.g., instructions included in memory 533 coupled to processor 531) and/or hardware logic (e.g., application specific integrated circuits, field-programmable gate arrays, and the like) that when executed by controller 505 causes controller 505 or system 500 to perform operations. The operations may be based on instructions stored within any one of, or a combination of, memory 533, local storage 535, photonic device simulator 539, and remote resources 515 accessed through network 513.

In the illustrated embodiment, modules 541-549 of photonic device simulator 539 are utilized to optimize structural parameters of the photonic device (e.g., mux/demux 109 of FIG. 1, demultiplexer 220 of FIG. 2A, multiplexer 250 of FIG. 2B, demultiplexer 320 of FIGS. 3A-3D, and demultiplexer 420 of FIGS. 4A-4B). In some embodiments, system 500 may optimize the structural parameters of the photonic device via, inter alia, simulations (e.g., operational and adjoint simulations) that utilize a finite-difference time-domain (FDTD) method to model the field response (e.g., electric and magnetic fields within the photonic device). The operational simulation engine 541 provides instructions for performing an electromagnetic simulation of the photonic device operating in response to an excitation source within a simulated environment. In particular, the operational simulation determines a field response of the simulated environment (and thus the photonic device, which is described by the simulated environment) in response to the excitation source for determining a performance metric of the physical device (e.g., based off an initial description or input design of the photonic device that describes the structural parameters of the photonic device within the simulated environment with a plurality of voxels). The structural parameters may correspond, for example, to the specific design, material compositions, dimensions, and the like of the physical device. Fabrication loss calculation logic 543 provides instructions for determining a fabrication loss, which is utilized to enforce a minimum feature size to ensure fabricability. In some embodiments, the fabrication loss is also used to enforce binarization of the design (i.e., such that the photonic device includes a first material and a second material that are interspersed to form a plurality of interfaces). Calculation logic 545 computes a loss metric determined via a loss function that incorporates a performance loss, based on the performance metric, and the fabrication loss. Adjoint simulation engine 547 is utilized in conjunction with the operational simulation engine 541 to perform an adjoint simulation of the photonic device to backpropagate the loss metric through the simulated environment via the loss function to determine how changes in the structural parameters of the photonic device influence the loss metric. Optimization engine 549 is utilized to update the structural parameters of the photonic device to reduce the loss metric and generate a revised description (i.e., revising the design) of the photonic device.

Figure 6A:
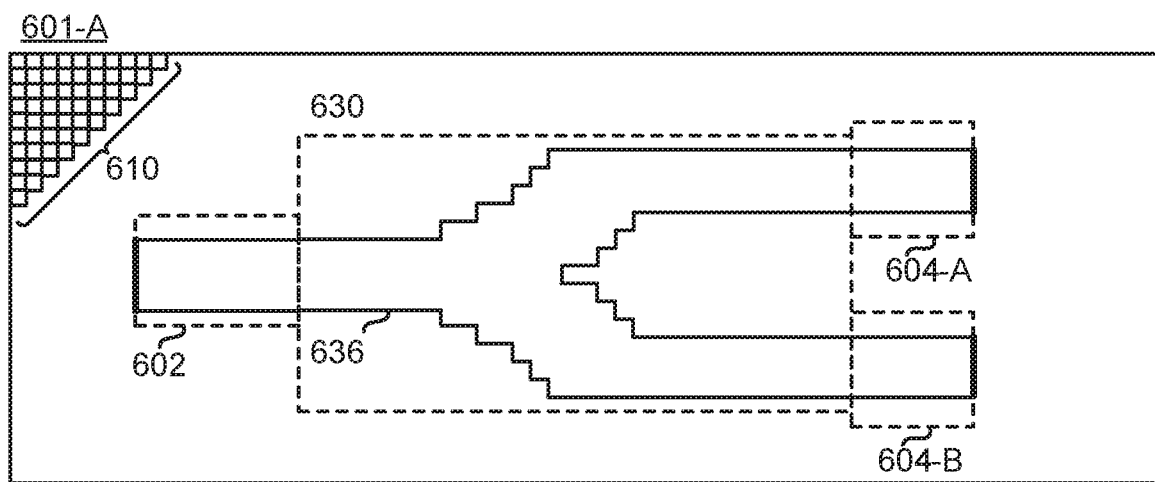
FIG. 6A illustrates a demonstrative simulated environment describing a photonic integrated circuit, in accordance with an embodiment of the present disclosure.
Figure 6B:
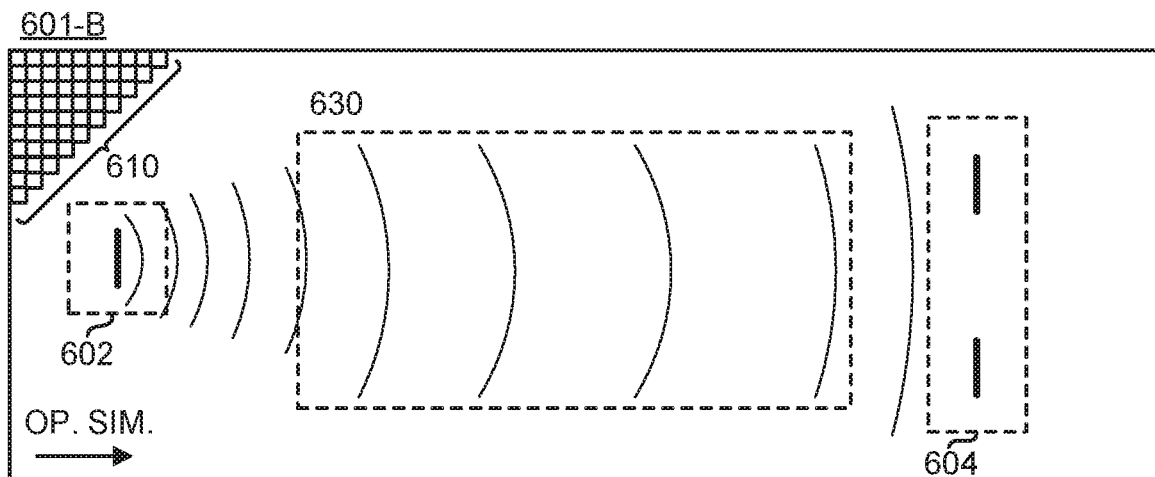
FIG. 6B illustrates an example operational simulation of a photonic integrated circuit, in accordance with an embodiment of the present disclosure.
Figure 6C:
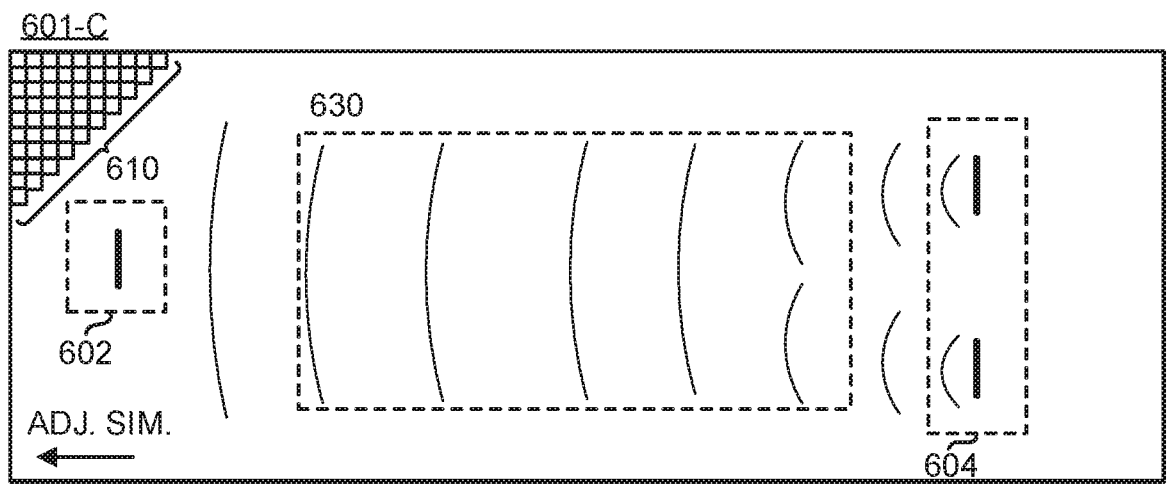
FIG. 6C illustrates an example adjoint simulation within the simulated environment by backpropagating a loss value, in accordance with an embodiment of the present disclosure.

FIGS. 6A-6C respectively illustrate an initial set up of a simulated environment 601-A describing a photonic device, performing an operational simulation of the photonic device in response to an excitation source within the simulated environment 601-B, and performing an adjoint simulation of the photonic device within the simulated environment 601-C. The initial set up of the simulated environment 601, 1-dimensional representation of the simulated environment 601, operational simulation of the physical device, and adjoint simulation of the physical device may be implemented with system 500 illustrated in FIG. 5. As illustrated in FIGS. 6A-6C, simulated environment 601 is represented in two-dimensions. However, it is appreciated that other dimensionality (e.g., 3-dimensional space) may also be used to describe simulated environment 601 and the photonic device. In some embodiments, optimization of structural parameters of the photonic device illustrated in FIGS. 6A-6C may be achieved via an inverse design process including, inter alia, simulations (e.g., operational simulations and adjoint simulations) that utilize a finite-difference time-domain (FDTD) method to model the field response (e.g., electric and magnetic field) to an excitation source.

FIG. 6A illustrates a demonstrative simulated environment 601-A describing a photonic integrated circuit (i.e., a photonic device such as a waveguide, demultiplexer, and the like), in accordance with an embodiment of the present disclosure. More specifically, in response to receiving an initial description of a photonic device defined by one or more structural parameters (e.g., an input design), a system (e.g., system 500 of FIG. 5) configures a simulated environment 601 to be representative of the photonic device. As illustrated, the simulated environment 601 (and subsequently the photonic device) is described by a plurality of voxels 610, which represent individual elements (i.e., discretized) of the two-dimensional (or other dimensionality) space. Each of the voxels is illustrated as two-dimensional squares; however, it is appreciated that the voxels may be represented as cubes or other shapes in three-dimensional space. It is appreciated that the specific shape and dimensionality of the plurality of voxels 610 may be adjusted dependent on the simulated environment 601 and photonic device being simulated. It is further noted that only a portion of the plurality of voxels 610 are illustrated to avoid obscuring other aspects of the simulated environment 601.

Each of the plurality of voxels 610 may be associated with a structural value, a field value, and a source value. Collectively, the structural values of the simulated environment 601 describe the structural parameters of the photonic device. In one embodiment, the structural values may correspond to a relative permittivity, permeability, and/or refractive index that collectively describe structural (i.e., material) boundaries or interfaces of the photonic device (e.g., interface pattern 431 of FIG. 4B). For example, an interface 636 is representative of where relative permittivity changes within the simulated environment 601 and may define a boundary of the photonic device where a first material meets or otherwise interfaces with a second material. The field value describes the field (or loss) response that is calculated (e.g., via Maxwell's equations) in response to an excitation source described by the source value. The field response, for example, may correspond to a vector describing the electric and/or magnetic fields (e.g., in one or more orthogonal directions) at a particular time step for each of the plurality of voxels 610. Thus, the field response may be based, at least in part, on the structural parameters of the photonic device and the excitation source.

In the illustrated embodiment, the photonic device corresponds to an optical demultiplexer having a design region 630 (e.g., corresponding to dispersive region 330 of FIG. 3A, and/or dispersive region 430 of FIG. 4A), in which structural parameters of the physical device may be updated or otherwise revised. More specifically, through an inverse design process, iterative gradient-based optimization of a loss metric determined from a loss function is performed to generate a design of the photonic device that functionally causes a multi-channel optical signal to be demultiplexed and guided from input port 602 to a corresponding one of the output ports 604. Thus, input port 602 (e.g., corresponding to input region 302 of FIG. 3A, input region 402 of FIG. 4A, and the like) of the photonic device corresponds to a location of an excitation source to provide an output (e.g., a Gaussian pulse, a wave, a waveguide mode response, and the like). The output of the excitation source interact with the photonic device based on the structural parameters (e.g., an electromagnetic wave corresponding to the excitation source may be perturbed, retransmitted, attenuated, refracted, reflected, diffracted, scattered, absorbed, dispersed, amplified, or otherwise as the wave propagates through the photonic device within simulated environment 601). In other words, the excitation source may cause the field response of the photonic device to change, which is dependent on the underlying physics governing the physical domain and the structural parameters of the photonic device. The excitation source originates or is otherwise proximate to input port 602 and is positioned to propagate (or otherwise influence the field values of the plurality of voxels) through the design region 630 towards output ports 604 of the photonic device. In the illustrated embodiment, the input port 602 and output ports 604 are positioned outside of the design region 630. In other words, in the illustrated embodiment, only a portion of the structural parameters of the photonic device is optimizable.

However, in other embodiments, the entirety of the photonic device may be placed within the design region 630 such that the structural parameters may represent any portion or the entirety of the design of the photonic device. The electric and magnetic fields within the simulated environment 601 (and subsequently the photonic device) may change (e.g., represented by field values of the individual voxels that collectively correspond to the field response of the simulated environment) in response to the excitation source. The output ports 604 of the optical demultiplexer may be used for determining a performance metric of the photonic device in response to the excitation source (e.g., power transmission from input port 602 to a specific one of the output ports 604.). The initial description of the photonic device, including initial structural parameters, excitation source, performance parameters or metrics, and other parameters describing the photonic device, are received by the system (e.g., system 500 of FIG. 5) and used to configure the simulated environment 601 for performing a first-principles based simulation of the photonic device. These specific values and parameters may be defined directly by a user (e.g., of system 500 in FIG. 5), indirectly (e.g., via controller 505 culling pre-determined values stored in memory 533, local storage 535, or remote resources 515), or a combination thereof.

FIG. 6B illustrates an operational simulation of the photonic device in response to an excitation source within simulated environment 601-B, in accordance with an embodiment of the present disclosure. In the illustrated embodiment, the photonic device is an optical demultiplexer structured to optically separate each of a plurality of distinct wavelength channels included in a multi-channel optical signal received at input port 602 and respectively guide each of the plurality of distinct wavelength channels to a corresponding one of the plurality of output regions 604. The excitation source may be selected (randomly or otherwise) from the plurality of distinct wavelength channels and originates at input region 602 having a specified spatial, phase, and/or temporal profile. The operational simulation occurs over a plurality of time steps, including the illustrated time step. When performing the operational simulation, changes to the field response (e.g., the field value) for each of the plurality of voxels 610 are incrementally updated in response to the excitation source over the plurality of time steps. The changes in the field response at a particular time step are based, at least in part, on the structural parameters, the excitation source, and the field response of the simulated environment 601 at the immediately prior time step included in the plurality of time steps. Similarly, in some embodiments the source value of the plurality of voxels 610 is updated (e.g., based on the spatial profile and/or temporal profile describing the excitation source). It is appreciated that the operational simulation is incremental and that the field values (and source values) of the simulated environment 601 are updated incrementally at each time step as time moves forward for each of the plurality of time steps during the operational simulation. It is further noted that in some embodiments, the update is an iterative process and that the update of each field and source value is based, at least in part, on the previous update of each field and source value.

Once the operational simulation reaches a steady state (e.g., changes to the field values in response to the excitation source substantially stabilize or reduce to negligible values) or otherwise concludes, one or more performance metrics may be determined. In one embodiment, the performance metric corresponds to the power transmission at a corresponding one of the output ports 604 mapped to the distinct wavelength channel being simulated by the excitation source. In other words, in some embodiments, the performance metric represents power (at one or more frequencies of interest) in the target mode shape at the specific locations of the output ports 604. A loss value or metric of the input design (e.g., the initial design and/or any refined design in which the structural parameters have been updated) based, at least in part, on the performance metric may be determined via a loss function. The loss metric, in conjunction with an adjoint simulation, may be utilized to determine a structural gradient (e.g., influence of structural parameters on loss metric) for updating or otherwise revising the structural parameters to reduce the loss metric (i.e. increase the performance metric). It is noted that the loss metric is further based on a fabrication loss value that is utilized to enforce a minimum feature size of the photonic device to promote fabricability of the device.

FIG. 6C illustrates an example adjoint simulation within simulated environment 601-C by backpropagating a loss metric, in accordance with an embodiment of the present disclosure. More specifically, the adjoint simulation is a time-backwards simulation in which a loss metric is treated as an excitation source that interacts with the photonic device and causes a loss response. In other words, an adjoint (or virtual source) based on the loss metric is placed at the output region (e.g., output ports 604) or other location that corresponds to a location used when determining the performance metric. The adjoint source(s) is then treated as a physical stimuli or an excitation source during the adjoint simulation. A loss response of the simulated environment 601 is computed for each of the plurality of time steps (e.g., backwards in time) in response to the adjoint source. The loss response collectively refers to loss values of the plurality of voxels that are incrementally updated in response to the adjoint source over the plurality of time steps. The change in loss response based on the loss metric may correspond to a loss gradient, which is indicative of how changes in the field response of the physical device influence the loss metric. The loss gradient and the field gradient may be combined in the appropriate way to determine a structural gradient of the photonic device/simulated environment (e.g., how changes in the structural parameters of the photonic device within the simulated environment influence the loss metric). Once the structural gradient of a particular cycle (e.g., operational and adjoint simulation) is known, the structural parameters may be updated to reduce the loss metric and generate a revised description or design of the photonic device.

In some embodiments, iterative cycles of performing the operational simulation, and adjoint simulation, determining the structural gradient, and updating the structural parameters to reduce the loss metric are performed successively as part of an inverse design process that utilizes iterative gradient-based optimization. An optimization scheme such as gradient descent may be utilized to determine specific amounts or degrees of changes to the structural parameters of the photonic device to incrementally reduce the loss metric. More specifically, after each cycle the structural parameters are updated (e.g., optimized) to reduce the loss metric. The operational simulation, adjoint simulation, and updating the structural parameters are iteratively repeated until the loss metric substantially converges or is otherwise below or within a threshold value or range such that the photonic device provides the desired performance while maintaining fabricability.

Figure 7A:
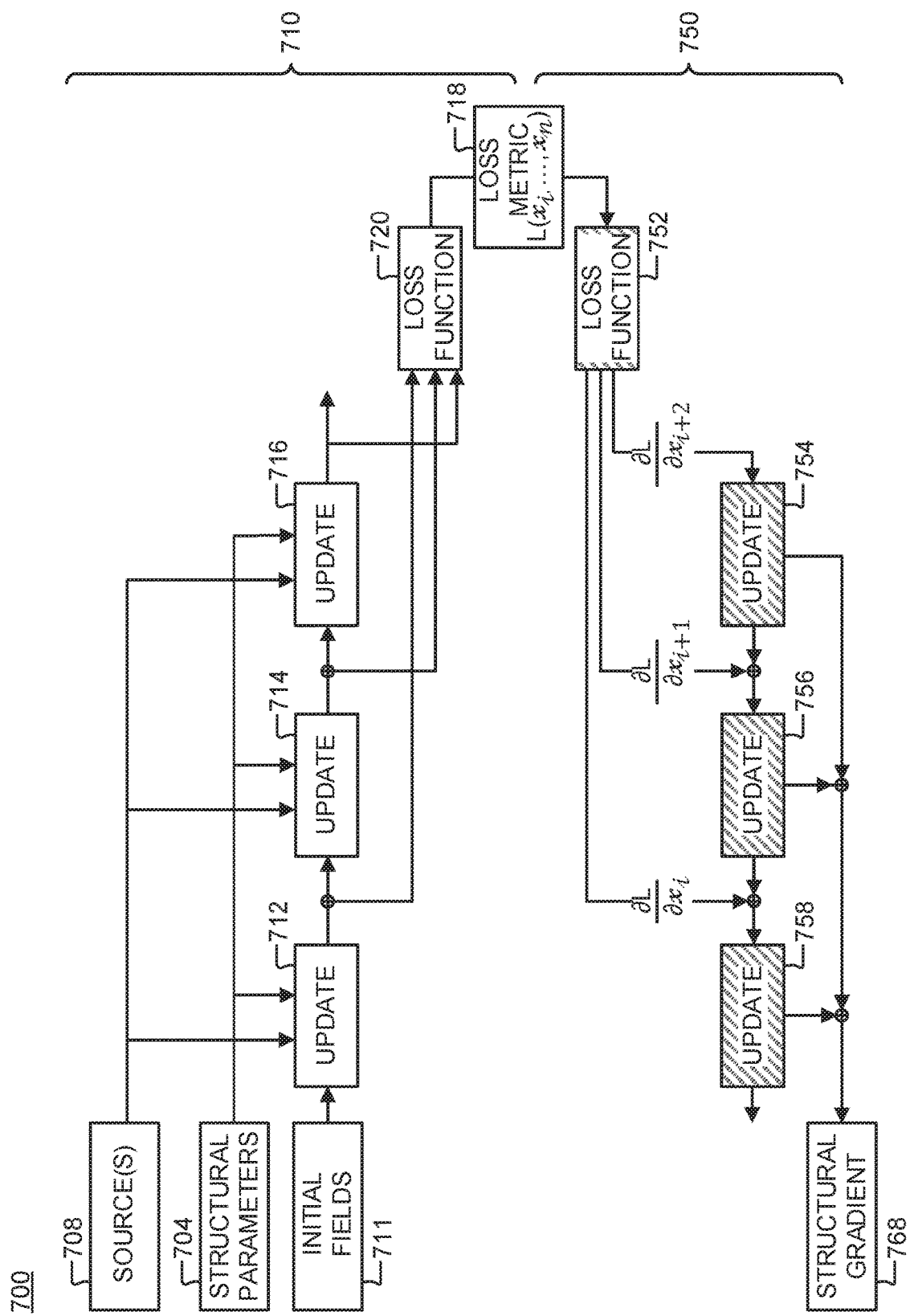
FIG. 7A is a flow chart illustrating example time steps for operational and adjoint simulations, in accordance with an embodiment of the present disclosure.

FIG. 7A is a flow chart 700 illustrating example time steps for the operational simulation 710 and adjoint simulation 750, in accordance with an embodiment of the present disclosure. Flow chart 700 is one possible implementation that a system (e.g., system 500 of FIG. 5) may use to perform the operational simulation 710 and adjoint simulation 750 of the simulated environment (e.g., simulated environment 601 of FIGS. 6A-6C) describing a photonic integrated circuit (e.g., an optical device operating in an electromagnetic domain such as photonic demultiplexer). In the illustrated embodiment, the operational simulation utilizes a finite-difference time-domain (FDTD) method to model the field response (both electric and magnetic) or loss response at each of a plurality of voxels (e.g., plurality of voxels 610 illustrated in FIGS. 6A-6C) for a plurality of time steps in response to physical stimuli corresponding to an excitation source and/or adjoint source.

As illustrated in FIG. 7A, the flow chart 700 includes update operations for a portion of operational simulation 710 and adjoint simulation 750. Operational simulation 710 occurs over a plurality of time-steps (e.g., from an initial time step to a final time step over a pre-determined or conditional number of time steps having a specified time step size) and models changes (e.g., from the initial field values 711) in electric and magnetic fields of a plurality of voxels describing the simulated environment and/or photonic device that collectively correspond to the field response. More specifically, update operations (e.g., 712, 714, and 716) are iterative and based on the field response, structural parameters 704, and one or more excitation sources 708. Each update operation is succeeded by another update operation, which are representative of successive steps forward in time within the plurality of time steps. For example, update operation 714 updates the field values 713 (see, e.g., FIG. 7B) based on the field response determined from the previous update operation 712, sources 708, and the structural parameters 704. Similarly, update operation 716 updates the field values 715 (see, e.g., FIG. 7B) based on the field response determined from update operation 714. In other words, at each time step of the operational simulation the field values (and thus field response) are updated based on the previous field response and structural parameters of the photonic device. Once the final time step of the operational simulation 710 is performed, the loss metric 718 may be determined (e.g., based on a pre-determined loss function 720). The loss gradients determined from block 752 may be treated as adjoint or virtual sources (e.g., physical stimuli or excitation source originating at an output region or port) which are backpropagated in reverse (from the final time step incrementally through the plurality of time steps until reaching the initial time step) to determine structural gradient 768.

In the illustrated embodiment, the FDTD solve (e.g., operational simulation 710) and backward solve (e.g., adjoint simulation 750) problem are described pictorially, from a high-level, using only "update" and "loss" operations as well as their corresponding gradient operations. The simulation is set up initially in which the structural parameters, physical stimuli (i.e., excitation source), and initial field states of the simulated environment (and photonic device) are provided (e.g., via an initial description and/or input design). As discussed previously, the field values are updated in response to the excitation source based on the structural parameters. More specifically, the update operation is given by $\phi$, where $x_{i+1}=\phi(x_i, b_i, z)$ for $i=1, \ldots, n$. Here, n corresponds to the total number of time steps (e.g., the plurality of time steps) for the operational simulation, where $x_i$ corresponds to the field response (the field value associated with the electric and magnetic fields of each of the plurality of voxels) of the simulated environment at time step i, $b_i$ corresponds to the excitation source(s) (the source value associated with the electric and magnetic fields for each of the plurality of voxels) of the simulated environment at time step i, and z corresponds to the structural parameters describing the topology and/or material properties of the physical device (e.g., relative permittivity, index of refraction, and the like).

It is noted that using the FDTD method, the update operation may specifically be stated as:

$$\phi(x_i, b_i, z) = A(z)x_i + B(z)b_i. \qquad (1)$$

That is to say the FDTD update is linear with respect to the field and source terms. Concretely, $A(z) \in \mathbb{R}^{N \times N}$ and $B(z) \in \mathbb{R}^{N \times N}$ are linear operators which depend on the structure parameters, z, and act on the fields, $x_i$, and the sources, $b_i$, respectively. Here, it is assumed that $x_i, b_i \in \mathbb{R}^N$ where N is the number of FDTD field components in the operational simulation. Additionally, the loss operation (e.g., loss function) may be given by $L = f(x_i, \ldots, x_n)$, which takes as input the computed fields and produces a single, real-valued scalar (e.g., the loss metric) that can be reduced and/or minimized.

In terms of revising or otherwise optimizing the structural parameters of the physical device, the relevant quantity to produce is $$\frac{dL}{dz},$$

which is used to describe the influence of changes in the structural parameters on the loss value and is denoted as the structural gradient 768 illustrated in FIG. 7A.

Figure 7B:
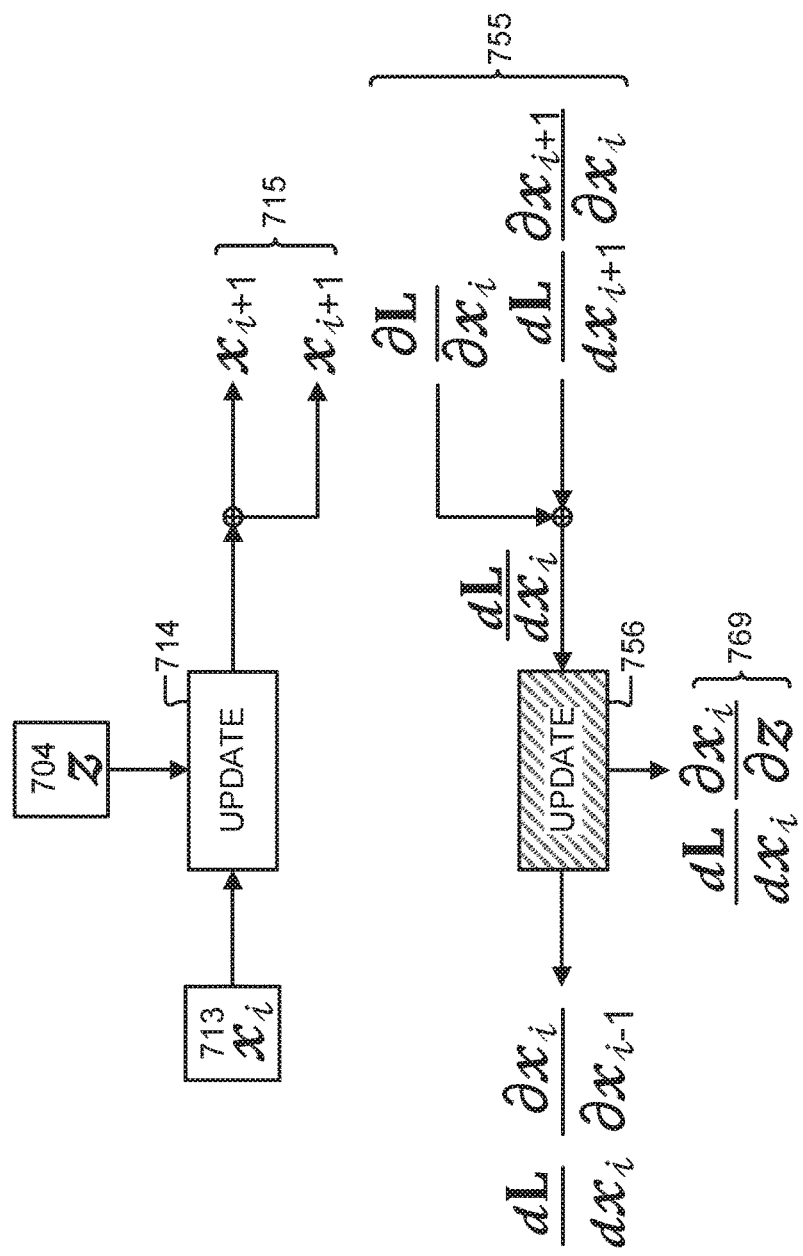
FIG. 7B is a chart illustrating a relationship between gradients determined from an operational simulation and an adjoint simulation, in accordance with an embodiment of the present disclosure.

FIG. 7B is a chart 780 illustrating the relationship between the update operation for the operational simulation and the adjoint simulation (e.g., backpropagation), in accordance with an embodiment of the present disclosure. More specifically, FIG. 7B summarizes the operational and adjoint simulation relationships that are involved in computing the structural gradient, $$\frac{dL}{dz},$$

which include $$\frac{\partial L}{\partial x_i}, \frac{\partial x_{i+1}}{\partial x_i}, \frac{dL}{dx_i}, \text{ and } \frac{\partial x_i}{\partial z}.$$

The update operation 714 of the operational simulation updates the field values 713, $x_i$, of the plurality of voxels at the ith time step to the next time step (i.e., i+1 time step), which correspond to the field values 715, $x_{i+1}$. The gradients 755 are utilized to determine $$\frac{dL}{dx_i}$$

for the backpropagation (e.g., update operation 756 backwards in time), which combined with the gradients 769 are used, at least in part, to calculate the structural gradient, $$\frac{dL}{dz} \cdot \frac{\partial L}{\partial x_i}$$

is the contribution of each field to the loss metric, L. It is noted that this is the partial derivative, and therefore does not take into account the causal relationship of $x_i \rightarrow x_{i+1}$. Thus, $$\frac{\partial x_{i+1}}{\partial x_i}$$

is utilized which encompasses the $x_i \rightarrow x_{i+1}$ relationship. The loss gradient, $$\frac{dL}{dx_i}$$

may also be used to compute the structural gradient, $$\frac{dL}{dz},$$

and corresponds to the total derivative of the field with respect to loss value, L. The loss gradient, $$\frac{dL}{dx_i},$$

at a particular time step, i, is equal to the summation of $$\frac{\partial L}{\partial x_i} + \frac{dL}{dx_{i+1}} \frac{\partial x_{i+1}}{\partial x_i}.$$

Finally, $$\frac{\partial x_i}{\partial z},$$

which corresponds to the field gradient, is used which is the contribution to $$\frac{dL}{dz}$$

from each time/update step.

In particular, the memory footprint to directly compute $$\frac{\partial L}{\partial x_i} \text{ and } \frac{dL}{dz}$$

is so large that it is difficult to store more than a handful of state Tensors. The state Tensor corresponds to storing the values of all of the FDTD cells (e.g., the plurality of voxels) for a single simulation time step. It is appreciated that the term "tensor" may refer to tensors in a mathematical sense or as described by the TensorFlow framework developed by Alphabet, Inc. In some embodiments the term "tensor" refers to a mathematical tensor which corresponds to a multidimensional array that follows specific transformation laws. However, in most embodiments, the term "tensor" refers to TensorFlow tensors, in which a tensor is described as a generalization of vectors and matrices to potentially higher dimensions (e.g., n-dimensional arrays of base data types), and is not necessarily limited to specific transformation laws. For example, for the general loss function $f$, it may be necessary to store the fields, $x_i$, for all time steps, i. This is because, for most choices of $f$, the gradient will be a function of the arguments of $f$. This difficulty is compounded by the fact that the values of $$\frac{\partial L}{\partial x_i}$$

for larger values of i are needed before the values for smaller i due to the incremental updates of the field response and/or through backpropagation of the loss metric, which may prevent the use of schemes that attempt to store only the values $$\frac{\partial L}{\partial x_i},$$

at an immediate time step.

An additional difficulty is further illustrated when computing the structural gradient, $$\frac{dL}{dz},$$

which is given by:

$$\frac{dL}{dz} = \sum_i \frac{dL}{dx_i} \frac{\partial x_i}{\partial z}. \tag{2}$$

For completeness, the full form of the first term in the sum, $$\frac{dL}{dz},$$

is expressed as:

$$\frac{dL}{dx_i} = \frac{\partial L}{\partial x_i} + \frac{dL}{dx_{i+1}} \frac{\partial x_{i+1}}{\partial x_i}. \tag{3}$$

Based on the definition of φ as described by equation (1), it is noted that $$\frac{\partial x_{i+1}}{\partial x_i} = A(z),$$

which can be substituted in equation (3) to arrive at an adjoint update for backpropagation (e.g., the update operations such as update operation 756), which can be expressed as:

$$\frac{dL}{dx_i} = \frac{\partial L}{\partial x_i} + \frac{dL}{dx_{i+1}} A(z), \text{ or} \quad (4)$$

$$\nabla_{x_i} L = A(z)^T \nabla_{x_{i+1}} L + \frac{\partial L^T}{\partial x_i}. \quad (5)$$

The adjoint update is the backpropagation of the loss gradient (e.g., from the loss metric) from later to earlier time steps and may be referred to as a backwards solve for $$\frac{dL}{dx_i}.$$

More specifically, the loss gradient may initially be based upon the backpropagation of a loss metric determined from the operational simulation with the loss function. The second term in the sum of the structural gradient, $$\frac{dL}{dz},$$

corresponds to the field gradient and is denoted as:

$$\frac{\partial x_i}{\partial z} = \frac{d\phi(x_{i-1}, b_{i-1}, z)}{dz} = \frac{dA(z)}{dz} x_{i-1} + \frac{dB(z)}{dz} b_{i-1}, \quad (6)$$

for the particular form of φ described by equation (1). Thus, each term of the sum associated $$\frac{dL}{dz}$$

depends on both $$\frac{dL}{dx_{i_0}} \text{ for } i >= i_0$$

and $x_{i_0}$ for $i < i_0$. Since the dependency chains of these two terms are in opposite directions, it is concluded that computing $$\frac{dL}{dz}$$

in this way requires the storage of $x_i$ values for all of i. In some embodiments, the need to store all field values may be mitigated by a reduced representation of the fields.

Figure 8:
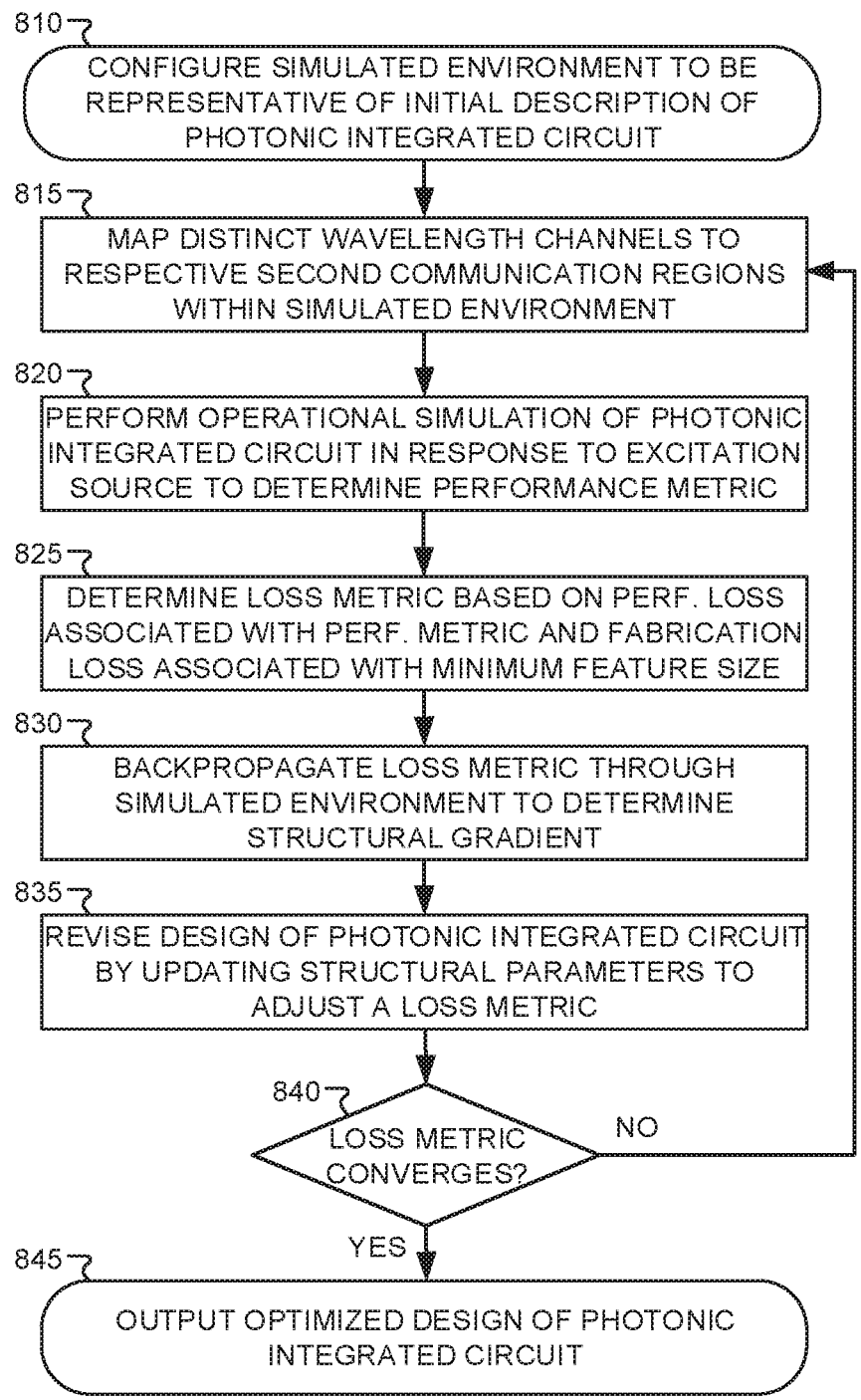
FIG. 8 shows an example method for generating a design of a photonic integrated circuit, in accordance with an embodiment of the present disclosure.

FIG. 8 shows an example method 800 for generating a design of a photonic integrated circuit, in accordance with an embodiment of the present disclosure. It is appreciated that method 800 is an inverse design process that may be accomplished by performing operations with a system (e.g., system 500 of FIG. 5) to perform iterative gradient-based optimization of a loss metric determined from a loss function that includes a performance loss and a fabrication loss. In the same or other embodiments, method 800 may be included as instructions provided by at least one machine-accessible storage medium (e.g., non-transitory memory) that, when executed by a machine, will cause the machine to perform operations for generating the design of the photonic integrated circuit. It is further appreciated that the order in which some or all of the process blocks appear in method 800 should not be deemed limiting. Rather, one of ordinary skill in the art having the benefit of the present disclosure will understand that some of the process blocks may be executed in a variety of orders not illustrated, or even in parallel.

Block 810 illustrates configuring a simulated environment to be representative of an initial description of a photonic integrated circuit (e.g., photonic device) that has been received or otherwise obtained. In some embodiments, the photonic integrated circuit may be expected to have a certain functionality (e.g., perform as an optical demultiplexer) after optimization. The initial description may describe structural parameters of the photonic integrated circuit within a simulated environment. The simulated environment may include a plurality of voxels that collectively describe the structural parameters of the photonic device. Each of the plurality of voxels is associated with a structural value to describe the structural parameters, a field value to describe the field response (e.g., the electric and magnetic fields in one or more orthogonal directions) to physical stimuli (e.g., one or more excitation sources), and a source value to describe the physical stimuli. Once the initial description has been received or otherwise obtained, the simulated environment is configured (e.g., the number of voxels, shape/arrangement of voxels, and specific values for the structural value, field value, and/or source value of the voxels are set based on the initial description). In some embodiments the initial description may be a first description of the physical device in which values for the structural parameters may be random values or null values outside of input and output regions such that there is no bias for the initial (e.g., first) design. It is appreciated that the initial description or input design may be a relative term. Thus, in some embodiments an initial description may be a first description of the physical device described within the context of the simulated environment (e.g., a first input design for performing a first operational simulation).

However, in other embodiments, the term initial description may refer to an initial description of a particular cycle (e.g., of performing an operational simulation, operating an adjoint simulation, and updating the structural parameters). In such an embodiment, the initial description or design of that particular cycle may correspond to a revised description or refined design (e.g., generated from a previous cycle). In one embodiment, the simulated environment includes a design region that includes a portion of the plurality of voxels which have structural parameters that may be updated, revised, or otherwise changed to optimize the structural parameters of the photonic device. In the same or other embodiments, the structural parameters are associated with geometric boundaries and/or material compositions of the physical device based on the material properties (e.g., relative permittivity, index of refraction, etc.) of the simulated environment.

In one embodiment the simulated environment includes a design region optically coupled between a first communication region and a plurality of second communication regions. In some embodiments, the first communication region may correspond to an input region or port (e.g., where an excitation source originates), while the second communication regions may correspond to a plurality of output regions or ports (e.g., when designing an optical demultiplexer that optically separates a plurality of distinct wavelength channels included in a multi-channel optical signal received at the input port and respectively guiding each of the distinct wavelength channels to a corresponding one of the plurality of output ports). However, in other embodiments, the first communication region may correspond to an output region or port, while the plurality of second communication regions corresponds to a plurality of input ports or region (e.g., when designing an optical multiplexer that optically combines a plurality of distinct wavelength signals received at respective ones of the plurality of input ports to form a multi-channel optical signal that is guided to the output port).

Block 815 shows mapping each of a plurality of distinct wavelength channels to a respective one of the plurality of second communication regions. The distinct wavelength channels may be mapped to the second communication regions by virtue of the initial description of the photonic device. For example, a loss function may be chosen that associates a performance metric of the photonic device with power transmission from the input port to individual output ports for mapped channels. In one embodiment, a first channel included in the plurality of distinct wavelength channels is mapped to a first output port, meaning that the performance metric of the photonic device for the first channel is tied to the first output port. Similarly, other output ports may be mapped to the same or different channels included in the plurality of distinct wavelength channels such that each of the distinct wavelength channels is mapped to a respective one of the plurality of output ports (i.e., second communication regions) within the simulated environment. In one embodiment, the plurality of second communication regions includes four regions and the plurality of distinct wavelength channels includes four channels that are each mapped to a corresponding one of the four regions. In other embodiments, there may be a different number of the second communication regions (e.g., 8 regions) and a different number of channels (e.g., 8 channels) that are each mapped to a respective one of the second communication regions.

Block 820 illustrates performing an operational simulation of the photonic integrated circuit within the simulated environment operating in response to one or more excitation sources to determine a performance metric. More specifically, an electromagnetic simulation is performed in which a field response of the photonic integrated circuit is updated incrementally over a plurality of time steps to determine how the how the field response of the physical device changes due to the excitation source. The field values of the plurality of voxels are updated in response to the excitation source and based, at least in part, on the structural parameters of the integrated photonic circuit. Additionally, each update operation at a particular time step may also be based, at least in part, on a previous (e.g., immediately prior) time step.

Consequently, the operational simulation simulates an interaction between the photonic device (i.e., the photonic integrated circuit) and a physical stimuli (i.e., one or more excitation sources) to determine a simulated output of the photonic device (e.g., at one or more of the output ports or regions) in response to the physical stimuli. The interaction may correspond to any one of, or combination of a perturbation, retransmission, attenuation, dispersion, refraction, reflection, diffraction, absorption, scattering, amplification, or otherwise of the physical stimuli within electromagnetic domain due, at least in part, to the structural parameters of the photonic device and underlying physics governing operation of the photonic device. Thus, the operational simulation simulates how the field response of the simulated environment changes due to the excitation source over a plurality of time steps (e.g., from an initial to final time step with a pre-determined step size).

In some embodiments, the simulated output may be utilized to determine one or more performance metrics of the photonic integrated circuit. For example, the excitation source may correspond to a selected one of a plurality of distinct wavelength channels that are each mapped to one of the plurality of output ports. The excitation source may originate at or be disposed proximate to the first communication region (i.e., input port) when performing the operational simulation. During the operational simulation, the field response at the output port mapped to the selected one of the plurality of distinct wavelength channels may then be utilized to determine a simulated power transmission of the photonic integrated circuit for the selected distinct wavelength channel. In other words, the operational simulation may be utilized to determine the performance metric that includes determining a simulated power transmission of the excitation source from the first communication region, through the design region, and to a respective one of the plurality of second communication regions mapped to the selected one of the plurality of distinct wavelength channels. In some embodiments, the excitation source may cover the spectrum of all of the plurality of output ports (e.g., the excitation source spans at least the targeted frequency ranges for the bandpass regions for each of the plurality of distinct wavelength channels as well as the corresponding transition band regions, and at least portions of the corresponding stopband regions) to determine a performance metric (i.e., simulated power transmission) associated with each of the distinct wavelength channels for the photonic integrated circuit. In some embodiments, one or more frequencies that span the passband of a given one of the plurality of distinct wavelength channels is selected randomly to optimize the design (e.g., batch gradient descent while having a full width of each passband including ripple in the passband that meets the target specifications). In the same or other embodiments, each of the plurality of distinct wavelength channels has a common bandwidth with different center wavelengths.

Block 825 shows determining a loss metric based on a performance loss associated with a performance metric and a fabrication loss associated with a minimum feature size. In some embodiments the loss metric is determined via a loss function that includes both the performance loss and the fabrication loss as input values. The performance loss may correspond to a difference between the performance metric and a target performance metric of the photonic integrated circuit. In some embodiments, a minimum feature size for the design region of the simulated environment may be provided to promote fabricability of the design generated by the inverse design process. The fabrication loss is based, at least in part, on the minimum feature size and the structural parameters of the design region. More specifically, the fabrication loss enforces the minimum feature size for the design such that the design region does not have structural elements with a diameter less than the minimum feature size. This helps this system provide designs that meet certain fabricability and/or yield requirements. In some embodiments the fabrication loss also helps enforce binarization of the design (i.e., rather than mixing the first and second materials together to form a third material, the design includes regions of the first material and the second material that are inhomogeneously interspersed).

In some embodiments the fabrication loss is determined by generating a convolution kernel (e.g., circular, square, octagonal, or otherwise) with a width equal to the minimum feature size. The convolution kernel is then shifted through the design region of the simulated environment to determine voxel locations (i.e., individual voxels) within the design region that fit the convolution kernel within the design region without extending beyond the design region. The convolution kernel is then convolved at each of the voxel locations with the structural parameters associated with the voxel locations to determine first fabrication values. The structural parameters are then inverted and the convolution kernel is convolved again at each of the voxel locations with the inverted structural parameters to determine second fabrication values. The first and second fabrication values are subsequently combined to determine the fabrication loss for the design region. This process of determining the fabrication loss may promote structural elements of the design region having a radius of curvature having a magnitude of less than a threshold size (i.e., inverse of half the minimum feature size).

Block 830 illustrates backpropagating the loss metric via the loss function through the simulated environment to determine an influence of changes in the structural parameters on the loss metric (i.e., structural gradient). The loss metric is treated as an adjoint or virtual source and is backpropagated incrementally from a final time step to earlier time steps in a backwards simulation to determine the structural gradient of the photonic integrated circuit.

Block 835 shows revising a design of the photonic integrated circuit (e.g., generated a revised description) by updating the structural parameters to adjust the loss metric. In some embodiments, adjusting for the loss metric may reduce the loss metric. However, in other embodiments, the loss metric may be adjusted or otherwise compensated in a manner that does not necessarily reduce the loss metric. In one embodiment, adjusting the loss metric may maintain fabricability while providing a general direction within the parameterization space to obtain designs that will ultimately result in increased performance while also maintaining device fabricability and targeted performance metrics. In some embodiments, the revised description is generated by utilizing an optimization scheme after a cycle of operational and adjoint simulations via a gradient descent algorithm, Markov Chain Monte Carlo algorithm, or other optimization techniques. Put in another way, iterative cycles of simulating the photonic integrated circuit, determining a loss metric, backpropagating the loss metric, and updating the structural parameters to adjust the loss metric may be successively performed until the loss metric substantially converges such that the difference between the performance metric and the target performance metric is within a threshold range while also accounting for fabricability and binarization due to the fabrication loss. In some embodiments, the term "converges" may simply indicate the difference is within the threshold range and/or below some threshold value.

Block 840 illustrates determining whether the loss metric substantially converges such that the difference between the performance metric and the target performance metric is within a threshold range. Iterative cycles of simulating the photonic integrated circuit with the excitation source selected from the plurality of distinct wavelength channels, backpropagating the loss metric, and revising the design by updating the structural parameters may be performed to reduce the loss metric until the loss metric substantially converges such that the difference between the performance metric and the target performance metric is within a threshold range. In some embodiments, the structural parameters of the design region of the integrated photonic circuit are revised when performing the cycles to cause the design region of the photonic integrated circuit to optically separate each of the plurality of distinct wavelength channels from a multi-channel optical signal received via the first communication region and guide each of the plurality of distinct wavelength channels to the corresponding one of the plurality of second communication regions based on the mapping of block 815.

Block 845 illustrates outputting an optimized design of the photonic integrated circuit in which the structural parameters have been updated to have the difference between the performance metric and the target performance metric within a threshold range while also enforcing a minimum feature size and binarization.

The processes explained above are described in terms of computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit ("ASIC") or otherwise.

A tangible machine-readable storage medium includes any mechanism that provides (i.e., stores) information in a non-transitory form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A multi-channel photonic demultiplexer, comprising:
an input region to receive a multi-channel optical signal including a plurality of distinct wavelength channels;
a plurality of output regions, each to receive a corresponding one of the plurality of distinct wavelength channels demultiplexed from the multi-channel optical signal; and
a dispersive region optically disposed between the input region and the plurality of output regions, wherein the dispersive region includes a first material and a second material inhomogeneously interspersed to form a plurality of interfaces that each correspond to a change in refractive index of the dispersive region and collectively structure the dispersive region to optically separate each of the plurality of distinct wavelength channels from the multi-channel optical signal and respectively guide each of the plurality of distinct wavelength channels to the corresponding one of the plurality of output regions when the input region receives the multi-channel optical signal,
wherein the plurality of interfaces form a material interface pattern along a cross-sectional area of the dispersive region that is at least partially surrounded by a periphery region that includes the second material, wherein the material interface pattern includes a plurality of islands, wherein a first island included in the plurality of islands is formed of the first material and surrounded by the second material, and wherein a second island included in the plurality of islands is formed of the second material and surrounded by the first material.

2. The multi-channel photonic demultiplexer of claim 1, wherein the material interface pattern includes protrusions, formed of the second material, that extend from the periphery region into the dispersive region.

3. The multi-channel photonic demultiplexer of claim 1, wherein the material interface pattern includes one or more dendritic shapes, wherein each of the one or more dendritic shapes are defined as a branched structure formed from the first material or the second material, and wherein the dendritic shape has a width that alternately increases and decreases in size along a corresponding direction.

4. The multi-channel photonic demultiplexer of claim 1, wherein the first material and the second material are arranged and shaped within the dispersive region such that the material interface pattern is substantially proportional to a design obtainable with an inverse design process.

5. The multi-channel photonic demultiplexer of claim 4, wherein the inverse design process includes iterative optimization of the design based, at least in part, on a loss function that incorporates a performance loss and a fabrication loss that is adjusted via the iterative optimization to generate the design.

6. The multi-channel photonic demultiplexer of claim 1, wherein the dispersive region is further structured to optically separate each of the plurality of distinct wavelength channels from the multi-channel optical signal within a predetermined area of 100 μm×100 μm or less when the input region receives the multi-channel optical signal.

7. The multi-channel photonic demultiplexer of claim 1, wherein the dispersive region is structured to accommodate a common bandwidth for each of the plurality of distinct wavelength channels, each having different center wavelengths, wherein the common bandwidth is approximately 13 nm wide, and wherein the different center wavelengths include at least one of 1271 nm, 1291 nm, 1311 nm, 1331 nm, 1511 nm, 1531 nm, 1551 nm, or 1571 nm.

8. The multi-channel photonic demultiplexer of claim 1, wherein the material interface pattern is shaped to enforce a minimum feature size within the dispersive region such that the plurality of interfaces within the cross-sectional area formed from the first material and second material do not have at least one of a radius of curvature with a magnitude of less than a first threshold size, a minimum width of less than a second threshold size, or a minimum spacing of less than a third threshold size.

9. The multi-channel photonic demultiplexer of claim 1, wherein the dispersive region is structured to have a power transmission of −2 dB or greater from the input region, through the dispersive region, and to the corresponding one of the plurality of output regions for a given wavelength included in the plurality of distinct wavelength channels.

10. The multi-channel photonic demultiplexer of claim 9, wherein the dispersive region is further structured to have at least one of an adverse power transmission for the given wavelength from the input region to any of the plurality of output regions other than the corresponding one of the plurality of output regions is −30 dB or less, ripple within a passband region of each of the plurality of distinct wavelength channels is 1 dB or less, or a maximum power reflection of the multi-channel optical signal is −40 dB or less.

11. The multi-channel photonic demultiplexer of claim 1, wherein the dispersive region includes a first side and a second side opposite the first side, wherein the input region is disposed proximate to the first side, wherein the plurality of output regions are disposed proximate to the second side, and wherein each one of the plurality of output regions is positioned parallel to each other one of the plurality of output regions.

12. The multi-channel photonic demultiplexer of claim 1, wherein adjacent pairs of the plurality of output regions are separated from each other by a common separation distance.

13. At least one machine-accessible storage medium that provides instructions that, when executed by a machine, will cause the machine to perform operations for generating a design of a photonic integrated circuit, the operations comprising:
configuring a simulated environment to be representative of an initial description of the photonic integrated circuit, wherein the simulated environment includes a design region optically coupled between a first communication region and a plurality of second communication regions, and wherein the design region is defined by structural parameters of the simulated environment;
mapping each of a plurality of distinct wavelength channels to a respective one of the plurality of second communication regions;
performing an operational simulation of the photonic integrated circuit within the simulated environment in response to an excitation source corresponding to a selected one of the plurality of distinct wavelength channels to determine a performance metric of the photonic integrated circuit;
determining a loss metric based, at least in part, on a difference between the performance metric and a target performance metric of the photonic integrated circuit;
backpropagating the loss metric through the simulated environment to determine a structural gradient corresponding to an influence of changes in the structural parameters on the loss metric; and revising the design of the photonic integrated circuit by updating the structural parameters to adjust the loss metric based, at least in part, on the structural gradient.

14. The at least one machine-accessible storage medium of claim 13, wherein the excitation source originates at or is disposed proximate to the first communication region when performing the operational simulation.

15. The at least one machine-accessible storage medium of claim 14, wherein determining the performance metric further includes determining a simulated power transmission of the excitation source from the first communication region, through the design region, and to the respective one of the plurality of second communication regions mapped to the selected one of the plurality of distinct wavelength channels when performing the operational simulation.

16. The at least one machine-accessible storage medium of claim 13, wherein one or more wavelengths within a passband region of each of the plurality of distinct wavelength channels is selected randomly for performing the operational simulation, and wherein each of the plurality of distinct wavelength channels have a common bandwidth with different center wavelengths.

17. The at least one machine-accessible storage medium of claim 13, that provides additional instructions that, when executed by the machine, will cause the machine to perform further operations including:
   providing a minimum feature size for the design region of the simulated environment; and
   determining a fabrication loss based on the minimum feature size, wherein the loss metric is based, at least in part, on the fabrication loss, and wherein the fabrication loss enforces the minimum feature size for the design such that the design region does not have structural elements with a width or spacing less than the minimum feature size.

18. The at least one machine-accessible storage medium of claim 17, wherein determining the fabrication loss includes:
   generating a convolution kernel with a width equal to the minimum feature size;
   shifting the convolution kernel through the design region of the simulated environment to determine voxel locations within the design region that fit the convolution kernel within the design region without extending beyond the design region;
   convolving the convolution kernel at each of the voxel locations with the structural parameters associated with the voxel locations to determine first fabrication values;
   inverting the structural parameters and convolving the convolution kernel at each of the voxel locations with the inverted structural parameters to determine second fabrication values; and
   combining the first fabrication values and the second fabrication values to determine the fabrication loss for the design region.

19. The at least one machine-accessible storage medium of claim 13, that provides additional instructions that, when executed by the machine, will cause the machine to perform further operations comprising:
   iteratively performing cycles of simulating the photonic integrated circuit with the excitation source selected from the plurality of distinct wavelength channels, backpropagating the loss metric, and revising the design by updating the structural parameters to adjust the loss metric until the loss metric substantially converges such that the difference between the performance metric and the target performance metric is within a threshold range.

20. A multi-channel photonic demultiplexer, comprising:
an input region to receive a multi-channel optical signal including a plurality of distinct wavelength channels;
a plurality of output regions, each to receive a corresponding one of the plurality of distinct wavelength channels demultiplexed from the multi-channel optical signal; and
a dispersive region optically disposed between the input region and the plurality of output regions, wherein the dispersive region includes a first material and a second material inhomogeneously interspersed to form a plurality of interfaces that each correspond to a change in refractive index of the dispersive region and collectively structure the dispersive region to optically separate each of the plurality of distinct wavelength channels from the multi-channel optical signal and respectively guide each of the plurality of distinct wavelength channels to the corresponding one of the plurality of output regions when the input region receives the multi-channel optical signal,
wherein the plurality of interfaces form a material interface pattern along a cross-sectional area of the dispersive region that is at least partially surrounded by a periphery region that includes the second material, wherein the material interface pattern includes a dendritic shape, wherein the dendritic shape is defined as a branched structure formed from the first material or the second material, and wherein the dendritic shape has a width that alternately increases and decreases in size along a corresponding direction.

21. A multi-channel photonic demultiplexer, comprising:
an input region to receive a multi-channel optical signal including a plurality of distinct wavelength channels;
a plurality of output regions, each to receive a corresponding one of the plurality of distinct wavelength channels demultiplexed from the multi-channel optical signal; and
a dispersive region optically disposed between the input region and the plurality of output regions, wherein the dispersive region includes a first material and a second material inhomogeneously interspersed to form a plurality of interfaces that each correspond to a change in refractive index of the dispersive region and collectively structure the dispersive region to optically separate each of the plurality of distinct wavelength channels from the multi-channel optical signal and respectively guide each of the plurality of distinct wavelength channels to the corresponding one of the plurality of output regions when the input region receives the multi-channel optical signal,
wherein the dispersive region is structured to have a power transmission of −2 dB or greater from the input region, through the dispersive region, and to the corresponding one of the plurality of output regions for a given wavelength included in the plurality of distinct wavelength channels, wherein the dispersive region is further structured to have at least one of an adverse power transmission for the given wavelength from the input region to any of the plurality of output regions other than the corresponding one of the plurality of output regions is −30 dB or less, ripple within a passband region of each of the plurality of distinct wavelength channels is 1 dB or less, or a maximum power reflection of the multi-channel optical signal is −40 dB or less.

\* \* \* \* \*